US011979975B2

(12) United States Patent
Kobernik et al.

(10) Patent No.: US 11,979,975 B2
(45) Date of Patent: May 7, 2024

(54) HIGH POWER ION BEAM GENERATOR SYSTEMS AND METHODS

(71) Applicant: SHINE Technologies, LLC, Janesville, WI (US)

(72) Inventors: Arne Kobernik, Monona, WI (US); Carl Sherven, Monona, WI (US); Casey Lamers, Monona, WI (US); Chris Seyfert, Monona, WI (US); Evan Sengbusch, Monona, WI (US); Gabriel Becerra, Monona, WI (US); Jin Lee, Monona, WI (US); Logan Campbell, Monona, WI (US); Mark Thomas, Monona, WI (US); Michael Taylor, Monona, WI (US); Preston Barrows, Monona, WI (US); Ross Radel, Monona, WI (US); Tye Gribb, Monona, WI (US)

(73) Assignee: SHINE Technologies, LLC, Janesville, WI (US)

(*) Notice: Subject to any disclaimer, the term of this patent is extended or adjusted under 35 U.S.C. 154(b) by 0 days.

(21) Appl. No.: 18/094,725

(22) Filed: Jan. 9, 2023

(65) Prior Publication Data
US 2023/0284369 A1  Sep. 7, 2023

Related U.S. Application Data

(63) Continuation of application No. 16/742,186, filed on Jan. 14, 2020, now Pat. No. 11,582,857, which is a
(Continued)

(51) Int. Cl.
H05B 7/22 (2006.01)
H01J 37/32 (2006.01)
(Continued)

(52) U.S. Cl.
CPC ......... *H05H 7/22* (2013.01); *H01J 37/32082* (2013.01); *H01J 41/14* (2013.01);
(Continued)

(58) Field of Classification Search
CPC .. H05H 7/22; H05H 1/46; H05H 1/54; H05H 3/06; H05H 5/04; H05H 6/00; H05H 9/02;
(Continued)

(56) References Cited

U.S. PATENT DOCUMENTS 4,735,764 A    4/1988  Sugawara
4,788,473 A   11/1988  Mori et al.
(Continued)

FOREIGN PATENT DOCUMENTS

CN        2836255       11/2006
JP      2003-110315      4/2003
(Continued)

OTHER PUBLICATIONS

Misra, A. et al. "Studies on the coupling transformer to improve the performance of microwave ion source" Sci. Instrum. 85. 063301 May 2014, 10 pages.
(Continued)

*Primary Examiner* — Minh D A
(74) *Attorney, Agent, or Firm* — Casimir Jones, S.C.; Brian F. Bradley

(57) ABSTRACT

Provided herein are high energy ion beam generator systems and methods that provide low cost, high performance, robust, consistent, uniform, low gas consumption and high current/high-moderate voltage generation of neutrons and protons. Such systems and methods find use for the commercial-scale generation of neutrons and protons for a wide variety of research, medical, security, and industrial processes.

19 Claims, 24 Drawing Sheets

Related U.S. Application Data continuation of application No. 16/196,766, filed on Nov. 20, 2018, now Pat. No. 10,701,792, which is a continuation of application No. 15/873,664, filed on Jan. 17, 2018, now Pat. No. 10,206,273.

(60) Provisional application No. 62/447,685, filed on Jan. 18, 2017.

(51) Int. Cl.
| | |
|---|---|
| H01J 41/14 | (2006.01) |
| H05B 31/26 | (2006.01) |
| H05H 1/46 | (2006.01) |
| H05H 1/54 | (2006.01) |
| H05H 3/06 | (2006.01) |
| H05H 5/04 | (2006.01) |
| H05H 6/00 | (2006.01) |
| H05H 7/22 | (2006.01) |
| H05H 9/02 | (2006.01) |
| H01J 37/08 | (2006.01) |
| H01J 41/04 | (2006.01) |
| H01T 23/00 | (2006.01) |

(52) U.S. Cl.
CPC .............. *H05B 31/26* (2013.01); *H05H 1/46* (2013.01); *H05H 1/54* (2013.01); *H05H 3/06* (2013.01); *H05H 5/04* (2013.01); *H05H 6/00* (2013.01); *H05H 9/02* (2013.01); *H01J 37/08* (2013.01); *H01J 41/04* (2013.01); *H01T 23/00* (2013.01); *H05H 1/4622* (2021.05)

(58) Field of Classification Search
CPC . H05H 1/4622; H05H 1/461; H01J 37/32082; H01J 41/14; H01J 37/08; H01J 41/04; H05B 31/26; H01T 23/00; Y02E 30/10; H01P 3/123; H01P 5/02
See application file for complete search history.

(56) References Cited

U.S. PATENT DOCUMENTS

| | | | |
|---|---|---|---|
| 6,204,606 B1 | 3/2001 | Spence et al. | |
| 6,806,651 B1 | 10/2004 | Chistyakov | |
| 6,925,137 B1 | 8/2005 | Forman et al. | |
| 7,939,812 B2 | 5/2011 | Glavish et al. | |
| 7,982,197 B2 | 7/2011 | Smick et al. | |
| 7,989,784 B2 | 8/2011 | Glavish et al. | |
| 8,044,374 B2 | 10/2011 | Ryding et al. | |
| 8,058,626 B2 | 11/2011 | Pursur | |
| 8,101,488 B1 | 1/2012 | Smick et al. | |
| 8,242,468 B2 | 8/2012 | Parrill | |
| 8,247,260 B2 | 8/2012 | Sivaram et al. | |
| 8,257,995 B2 | 9/2012 | Hilali et al. | |
| 8,268,645 B2 | 9/2012 | Kell et al. | |
| 8,324,592 B2 | 12/2012 | Ryding et al. | |
| 8,324,599 B2 | 12/2012 | Smick | |
| 8,338,209 B2 | 12/2012 | Hilali | |
| 8,384,018 B2 | 2/2013 | Esin et al. | |
| 8,837,662 B2 | 9/2014 | Piefer | |
| 8,995,838 B1 | 3/2015 | Schaffner et al. | |
| 9,008,256 B2* | 4/2015 | Stubbers | H05H 6/00 376/109 |
| 9,024,261 B2* | 5/2015 | Piefer | H05H 3/06 250/358.1 |
| 9,147,581 B2 | 9/2015 | Guha et al. | |
| 9,346,565 B1 | 5/2016 | Hardy et al. | |
| 9,404,198 B2 | 8/2016 | Yakub | |
| 9,499,921 B2 | 11/2016 | Yakub et al. | |
| 10,206,273 B2 | 2/2019 | Kobernik et al. | |
| 2009/0224700 A1 | 9/2009 | Chen et al. | |
| 2009/0309046 A1 | 12/2009 | Balakin | |
| 2011/0096887 A1 | 4/2011 | Piefer | |
| 2012/0160059 A1 | 6/2012 | Holber et al. | |
| 2012/0300890 A1 | 11/2012 | Piefer | |
| 2013/0170592 A1 | 7/2013 | Zhou et al. | |
| 2013/0228709 A1* | 9/2013 | Umeda | H05G 2/008 250/493.1 |
| 2014/0179978 A1 | 6/2014 | Pantell et al. | |
| 2014/0292195 A1 | 10/2014 | Kim et al. | |
| 2014/0311704 A1 | 10/2014 | Yokoyama et al. | |
| 2015/0031931 A1 | 1/2015 | Nishiuchi et al. | |
| 2015/0044447 A1 | 2/2015 | Henley | |
| 2015/0098544 A1 | 4/2015 | Blanovsky et al. | |
| 2015/0340279 A1 | 11/2015 | Kobayashi et al. | |
| 2016/0163495 A1 | 6/2016 | Sherman et al. | |
| 2016/0295678 A1 | 10/2016 | Navarro-Sorroche et al. | |
| 2016/0319462 A1 | 11/2016 | Henley | |
| 2018/0206323 A1 | 7/2018 | Kobernik et al. | |

FOREIGN PATENT DOCUMENTS

| | | |
|---|---|---|
| JP | 2015220076 | 12/2015 |
| WO | WO 1994008439 A1 | 4/1994 |
| WO | WO 2017021808 A1 | 2/2017 |
| WO | WO 2018144225 A2 | 8/2018 |

OTHER PUBLICATIONS

Valdiviez, R. et al. "The Mechanical Design and Fabrication of a Ridge-loaded Waveguide for an RFQ" Proceedings of the 19 Linac International Conference, Dec. 1998, p. 597-599.

International Search Report and Written Opinion of related PCT/US2018/014072, mailed Nov. 1, 2018, 18 pages.

Henley, Kerf-less wafer production, Photon's 4th PV Production Equipment Conference, Mar. 4, 2009, 37 pages.

Felch et al., Ion implantation for semiconductor devices: The largest use of industrial accelerators, Proceedings of PAC2013, Pasadena, CA USA, 2013, pp. 740-744.

Soitec "Smart Cut Technology" Retrieved Jun. 12, 2018, 7 pages, Retrieved online: www.soitec.com/en/products/smart-cut.

Axcelis "High Energy Implant" Retrieved Jun. 12, 2018, 1 page, Retrieved online: www.axcelis.com/products/high-energy.

Xiao, L. et al. Design of 4-5 GHz Transition from Double-ridge Waveguide to Coaxial Line, 2016 Progress in Electromagnetic Research Symposium (PIERS), Shanghai, CN, Aug. 8-11, 3 pages.

Song Young-Gi: "Interlock system for machine protection of the Komac 100-MeV proton linac" Journal of the Korean Physical Society, The Korean Physical Society, Seoul, vol. 66, No. 3, Feb. 22, 2015, pp. 449-453.

Arredondo I et al.: "Adjustable ECR Ion Source Control System: Ion Source Hydrogen Positive Project" IEEE Transactions on Nuclear Science, IEEE, USA, vol. 62, No. 3, Jun. 1, 2015, pp. 903-910.

Beadle E R et al.: "The AGS booster beam loss monitor system", Proceedings of the Particle Accelerator Conference. San Francisco, May 6-9, 1991; vol. CONF. 14, May 6, 1991, pp. 1231-1233.

Sibley C Ed—Chew J et al.: "Machine protection strategies for high power accelerators", Proceedings of the 2003 Particle Accelerator Conference. PAC 2003. Portland, OR, May 12-16, 2003, vol. 1, May 12, 2003, pp. 607-611.

EP Search Report, EP Patent Application No. 23199192.8, dated Jan. 22, 2024, 3 pages.

* cited by examiner

Water channel

HIGH POWER ION BEAM GENERATOR SYSTEMS AND METHODS

The present application is a continuation of U.S. application Ser. No. 16/742,186, filed Jan. 14, 2020, which is a continuation of U.S. application Ser. No. 16/196,766, filed Nov. 20, 2018, now U.S. Pat. No. 10,701,792, which is a continuation of U.S. application Ser. No. 15/873,664, filed Jan. 17, 2018, now U.S. Pat. No. 10,206,273, which claims priority to U.S. Provisional application Ser. No. 62/447,685, filed Jan. 18, 2017, each of which is herein incorporated by reference in its entirety.

STATEMENT REGARDING FEDERALLY SPONSORED RESEARCH OR DEVELOPMENT

This invention was made with government support under W15QKN-14-C-0096 awarded by the U.S. Army and DE-NA-0002598 awarded by the U.S. Department of Energy. The government has certain rights in the invention.

FIELD

Provided herein are high energy ion beam generator systems and methods that provide low cost, high performance, robust, consistent, uniform, high efficiency, and high current/high-moderate voltage generation of neutrons and protons. Such systems and methods find use for the commercial-scale generation of neutrons and protons for a wide variety of research, medical, security, and industrial processes.

BACKGROUND

Particle accelerators are devices that energize ions and drive them into a target. Neutron generators are a specific use of particle accelerator that produce neutrons by fusing isotopes of hydrogen. A fusion reaction takes place by accelerating either deuterium, tritium or a mixture of the two isotopes into a target that also contains deuterium, tritium or a mixture of the isotopes. Fusion of deuterium atoms results half of the time in formation of a $^3$He ion and a neutron, the other half resulting in the formation of a $^3$H (tritium) ion and a proton. Fusion of a deuterium and a tritium atom results in the formation of a $^4$He ion and a neutron.

Particle accelerators and neutron generators have numerous applications in medicine, imaging, industrial processes (e.g., on-line analyzers, metal cleanliness, raw materials, Al base catalysts, energy production), material analysis, safeguards (e.g., nuclear material detection), research, education, exploration, security (e.g., explosive detection, chemical weapon detection, contraband detection), and ion implantation.

Historically, neutron generation has involved incredibly complex and expensive systems and employed approaches that either generate or use undue levels of hazardous materials or provide insufficient neutron output to satisfy commercial needs. Radioactive sources capable of producing high neutron levels contain hazardous quantities of radiation requiring many safety considerations. Neutrons can also be produced by nuclear reactions with accelerators (e.g., cyclotrons, Van de Graaff accelerators, LINAC) with large yields, but at substantial cost and complexity of operation. Use of neutron generators using deuterium-tritium (DT) reactions addressed some of the safety problems, but required sealing because of tritium content and have a typically short lifetime. Attempts at using deuterium-deuterium (DD) neutron generators have met with limited success because of the ~100× lower fusion cross section of the DD reaction compared to the DT reaction.

The cost, lack of efficiency, safety concerns, and lack of durability of existing systems has kept them from finding use in many commercial applications that could benefit from neutron generators. Addressing these problems in this field has been very complex and routine optimization or alteration of existing systems has failed to provide meaningful or practical solutions.

SUMMARY

Provided herein are high energy ion beam generator systems and methods that provide low cost, high performance, robust, consistent, uniform, low gas consumption, low fuel consumption, and high current/high-moderate voltage neutron and proton generation. The systems and methods provide a balance of throughput, cost, and reliability previously unachieved. Such systems provide viable commercial-scale neutron and proton generation for commercial processes such as semi-conductor and LED manufacture, among many others.

Multiple performance enhancing technologies are described herein that individually and collectively contribute to the high performing high energy ion beam generator systems and methods. It should be understood that unless expressly stated otherwise or contrary to logic each of the technologies described herein may be used in combination with each other to provide generators with desirable performance features and characteristics. The technologies are grouped, for convenience, within the following categories: I) ion source technologies; II) infrastructure technologies; III) high voltage systems technologies; IV) neutron producing target technologies; V) automated control system technologies; and VI) exemplary applications and indications. Particular technologies within each group and between groups may be used in combination.

Individually or collectively these technologies may be applied to any high energy ion beam generator system having the relevant components. To illustrate embodiments of the technology, many of the features are described in the context of high energy ion beam generators employed by Phoenix Nuclear Labs, LLC (Monona, Wisconsin), see e.g., U.S. Pat. Publ. No. 2011/0096887, 2012/0300890, and 2016/0163495 and U.S. Pat. Nos. 8,837,662 and 9,024,261, herein incorporated by reference in their entireties. However, it should be understood that these technologies may be applied to a wide range of high energy ion beam generators and component parts thereof including those by Pantechnik (Bayeux, France), D-Pace (British Columbia, Canada), Adelphi Tech Inc. (Rosewood City, California) (see e.g., U.S. Pat. Publ. No. 2014/0179978, herein incorporated by reference in its entirety), Starfire Industries, LLC (Champaign, Illinois) (see e.g., U.S. Pat. No. 9,008,256, herein incorporated by reference in its entirety), Thermo Fisher Scientific (see e.g., U.S. Pat. No. 8,384,018, herein incorporated by reference in its entirety), and Sodern (Limeil-Brevannes, France).

Uses for such systems include, but are not limited to, semiconductor manufacture (e.g., silicon cleaving for photovoltaic semiconductor applications), isotope production and separation, cyclotron injection systems, accelerator mass spectrometry, security (e.g., explosives detection), industrial diagnostics and quality control, and imaging. Cyclotrons are widely used across medical and industrial fields. Ion beams are used in a wide range of settings in the semiconductor industry. Better ion sources translate to cheaper, more efficient, and more effective production techniques for circuit components that are the building blocks of all modern IC-based technologies. In another example, negative ion sources find use in the field of magnetic confinement fusion energy.

For decades scientists have sought to develop an energy source based on nuclear fusion reactions, as it could potentially provide an essentially unlimited amount of clean energy with virtually no harmful byproducts. Though fusion energy technologies have advanced immensely over the past several decades, there are still a number of technical challenges that have prevented the development of a clean fusion energy reactor. One challenge faced by fusion energy is unreliable high current negative ion sources. Existing negative ion fusion injectors use filaments and/or magnetically coupled plasmas that suffer from many of the deficiencies discussed herein. A reliable, long lifetime negative ion source drastically increases the ion source conversion efficiency, lifetime, reliability, and current output.

In some embodiments, provided herein are devices comprising: a) a waveguide comprising: i) a proximal end comprising an electromagnetic wave entry point, ii) a distal end comprising an electromagnetic wave exit point, and iii) outer walls extending between the proximal end and the distal end and configured to propagate electromagnetic waves; and b) an inverted impendence matching component located inside the waveguide component, wherein the inverted impedance matching component extends from the distal end of the waveguide to at least partway towards the proximal end of the waveguide, and wherein the inverted impedance matching component comprises a distal end and a proximal end, wherein the distal end of the impedance matching component is located at or near the distal end of the waveguide and has a greater cross-sectional area than the proximal end of the inverted impedance matching component.

In certain embodiments, the inverted impedance matching component comprises metal. In further embodiments, the inverted impedance matching component is configured to be cooled by water. In other embodiments, the inverted impedance matching component is located along the midline of the waveguide. In additional embodiments, the inverted impedance matching component is supported by one or more support legs attached to the outer walls of the wave guide. In certain embodiments, the electromagnetic waves are microwaves. In further embodiments, the cross-sectional area at the distal end of the inverted impedance matching component is at least two times, or three times, or four times, as large as the cross-sectional area at the proximal end of the inverted impedance matching component. In some embodiments, the inverted impedance matching component comprises one or more steps (e.g., 2, 3, 4, 5, 6, 7 . . . 10 . . . or 20) that allow the cross-sectional area to change from the proximal to the distal ends of the inverted impedance matching component.

In further embodiments, the inverted impedance matching component comprises a taper from the proximal to the distal ends of the inverted impedance matching component that thereby allows the cross-sectional area to change. In certain embodiments, the cross-sectional area at the distal end of the inverted impedance matching component is large enough to block all or nearly all back flowing electrons when the device is part of an accelerator system.

In particular embodiments, provided herein are systems comprising: a) an electromagnetic wave source; b) a plasma chamber; and c) the device described above (and herein) composed of a waveguide and inverted impedance matching component. In some embodiments, the proximal end of the waveguide is operably attached to the electromagnetic wave source, and wherein the distal ends of the waveguide is operably attached to the plasma chamber. In further embodiments, the electromagnetic wave source comprises a microwave source.

In some embodiments, provided herein are systems comprising: a) a computer processor; b) non-transitory computer memory comprising one or more computer programs and a database, wherein the one or more computer programs comprises accelerator system monitoring and/or optimization software, and c) an accelerator system that generates a high-energy ion beam (e.g., that generates neutrons or protons) comprising one or more of the following sub-systems which are in operable communication with the non-transitory computer memory, and which can be automatically adjusted by the accelerator system monitoring and/or optimization software: i) an ion source and an ion source monitoring component; ii) a focus solenoid magnet and a focus solenoid magnet monitoring component; iii) a tube aperture and a tube aperture monitoring component; iv) a solid or gas target and a solid or gas target monitoring component; v) an ion beam extraction and secondary electron suppression component and an extraction and suppression monitoring component; vi) a beam generating sub-system and beam generating sub-system monitoring component; vii) a beam focusing and steering sub-system and beam focusing and steering sub-system monitoring component; viii) an accelerator/resistor sub-system and accelerator/resistor sub-system monitoring component; ix) a beam steering sub-system and a beam steering sub-system monitoring component; and x) pressurized gas sub-system component and a pressurized gas sub-system component monitoring component.

In certain embodiments, 1) the ion source monitoring component comprises a mass flow meter, thermocouple, coolant flow meter, and/or a pressure gauge; 2) the focus solenoid monitoring component comprises a thermocouple, coolant flow meter, voltage monitor, and/or current monitor; 3) the tube aperture monitoring component comprises a camera, thermocouples, and/or a coolant flow meter; 4) the solid or gas target monitoring component comprises a camera, thermocouple, coolant flow meter, and/or radiation detector; 5) the extraction and suppression monitoring component comprises a pressure gauge, a thermocouple, a current monitor, and/or a voltage monitor; 6) the beam generating sub-system monitoring component comprises a current monitors and/or emittance scanner; and 7) the a pressurized gas sub-system component monitoring component comprising a pressure gauges and/or gas analyzer.

In particular embodiments, the accelerator system monitoring and/or optimization software is configured to collect and analyze a plurality of different set-points of the sub-systems and calculate optimized setting for such sub-systems. In other embodiments, the accelerator system monitoring and/or optimization software is configured to change the set points on one or more of the sub-systems to at least partially optimize performance of the accelerator system.

In some embodiments, provided herein are systems comprising: a) an ion source plasma chamber, wherein the plasma chamber has a source axis along the direction of a beam exiting the plasma chamber, b) at least one ion source magnet (e.g., solenoid or permanent magnet), wherein the at least one ion source magnet comprises an opening and at least one outer wall, wherein the ion source plasma chamber extends through the opening of the at least one ion source magnet; c) at least one receiving component attached to, or integral with, the at least one outer wall of the at least one ion source magnet; d) a ferromagnetic enclosure, wherein the at least one ion source magnet and the ion source plasma chamber are inside the ferromagnetic enclosure, wherein the at least one ion source magnet is able to move to a plurality of different positions inside the ferromagnetic enclosure along the source axis of the plasma chamber; wherein ferromagnetic enclosure comprises at least one longitudinal opening that extends along the direction of the source axis and aligns with the receiving component; and e) at least one adjustment component configured to extend through the longitudinal opening and attach to the receiving component, wherein the at least one adjustment component is able to secure the at least one ion source magnet at the plurality of different positions inside the ferromagnetic enclosure.

In certain embodiments, the receiving component comprises a threaded metal connector, or snap receiver or pin hole. In particular embodiments, the adjustment component comprises a threaded bolt. In other embodiments, the receiving component is glued to the at least one ion source magnet (e.g., solenoid magnet or permanent magnet). In some embodiments, the at least one ion source magnet is at least partially encased in epoxy. In other embodiments, at least one ion source magnet comprises two or three or four ion source magnets. In additional embodiments, the at least one longitudinal opening comprises at least two, three, or four longitudinal openings.

In some embodiments, provided herein are methods comprising: a) providing a system as described immediately above, or elsewhere herein; b) moving the at least one ion source magnet (e.g., solenoid magnet or permanent magnet) from a first position among the plurality of positions to a second position among the plurality of positions, c) inserting the at least one adjustment component through the at least one longitudinal opening into the at least one receiving component; and d) securing the at least one adjustment component to the at least one receiving component, thereby securing the at least one ion source magnet in the second position. In certain embodiments, the at least one ion source magnet comprises first and second ion source magnets, and wherein both the first and second ion source magnets are moved from a first position to a second position, and secured in the second position.

In some embodiments, provided herein are articles of manufacture comprising: a metallic assembly of an accelerator system that generates a high-energy ion beam, wherein the metallic assembly, when positioned in the accelerator system partially intercepts the high-energy ion beam, and wherein the metallic assembly comprises: a first metal component, a second metal component, and filler metal, wherein the filler metal attaches the first metal component to the second metal component at a joint (e.g., brazed joint).

In certain embodiments, provided herein are articles of manufacture comprising: a metallic assembly of an accelerator system that generates a high-energy ion beam, wherein the metallic assembly, when positioned in the accelerator system: i) partially intercepts the high-energy ion beam, and ii) is in a vacuum environment, and wherein the metallic assembly comprises: i) at least one water cooling channel, and ii) a first metal component, a second metal component, and filler metal, wherein the filler metal attaches the first metal component to the second metal component at a joint (e.g., brazed joint).

In particular embodiments, the first and second metal components comprise highly thermally conductive metal (e.g., copper, aluminum, etc.). In certain embodiments, the filler metal has a lower melting point than the first and second metal components. In particular embodiments, the first metal component comprises a tube plate and the second metal component comprises a plate plug. In particular embodiments, the filler metal comprises BNi-7 alloy, BNi-6 alloy, $Pd_{100}$, $Pt_{100}$, $Ni_{100}$, or other metals or alloys suitable for brazing together the first and second metal components. In certain embodiments, the first metal component comprises a first item selected from the group consisting of a first tube, a tube cap, a different tube plate, and a valve, and wherein the second metal component comprises a second item selected from the group consisting of a second tube, a tube cap, a different tube plate, and a valve. In certain embodiments, the at least one water cooling channel comprises at least two water cooling channels (e.g., 2, 3, 4, 5, 6 . . . 10 . . . or 25 water cooling channels).

In additional embodiments, provided herein are systems comprising: a) an accelerator system that generates an ion beam (e.g., high-energy ion beam); and b) a metallic assembly, wherein the metallic assembly is positioned in the accelerator system such that it: i) partially intercepts the high-energy ion beam, and ii) is in a vacuum environment, and wherein the metallic assembly comprises a first metal component, a second metal component, and filler metal, wherein the filler metal attaches the first metal component to the second metal component at a joint (e.g., a brazed joint).

In some embodiments, provided herein are systems comprising: a) an accelerator system that generates an ion beam (e.g., high-energy ion beam); and b) a metallic assembly, wherein the metallic assembly is positioned in the accelerator system such that it: i) partially intercepts the high-energy ion beam, and ii) is in a vacuum environment, and wherein the metallic assembly comprises: i) at least one water cooling channel, and ii) a first metal component, a second metal component, and filler metal, wherein the filler metal attaches the first metal component to the second metal component at a joint (e.g., a brazed joint).

In certain embodiments, provided herein are methods comprising: a) attaching a first metallic component to a second metallic component with a filler metal using a brazing technique to generate a metallic assembly, and b) inserting the metallic assembly into an accelerator system that generates a high-energy ion beam, wherein the metallic assembly is positioned to partially intercept the high-energy ion beam.

In some embodiments, the metallic assembly further comprises at least one water cooling channel. In other embodiments, the metallic assembly is further positioned such that it is in a vacuum environment.

In some embodiments, provided herein are systems comprising: a) a high voltage dome; b) an ion source plasma chamber located inside the high voltage dome; c) an extraction component that is operably linked to the ion source plasma chamber; and d) a gas removal sub-system comprising: i) an exhaust component located inside the high voltage dome; ii) an insulating hose, wherein a first part of the insulating hose is located inside the high voltage dome and a second part of the insulating hose is located outside of the high voltage dome in an area of lower voltage; iii) a first vacuum pump located inside the high voltage dome and operably linked to the exhaust component and the extraction component, wherein the first vacuum pump is configured to remove gas from the extraction component and deliver the gas to the exhaust component; and iv) a second vacuum pump located inside the high voltage dome and operably linked to the exhaust component, wherein the second vacuum pump is configured to receive the gas from the exhaust component at a first pressure and deliver the gas to the insulating hose at a second pressure, wherein the second pressure is higher than the first pressure.

In certain embodiments, the system further comprises e) an outer pressure vessel, wherein the high voltage dome, the ion source plasma chamber, the extraction component, the exhaust component, the first vacuum pump, the second pump, and at least part of the insulating hose are located in the outer pressure vessel. In other embodiments, the insulating hose is configured to vent the gas to the atmosphere. In some embodiments, the gas is non-ionized gas. In other embodiments, the non-ionized gas is deuterium gas. In certain embodiments, the system further comprises the gas. In particular embodiments, the gas is non-ionized gas. In additional embodiments, the insulating hose has a helix shape. In further embodiments, the insulating hose has about 20-30 helix shaped turns, and is about 5-15 feet in length. In other embodiments, the first vacuum pump comprises a pump selected from the group consisting of: a turbomolecular pump, a cryopump, an ion pump, and a high vacuum pump. In some embodiments, the second vacuum pump comprises a roughing pump. In other embodiments, the system further comprises: e) an inner pressure vessel located inside the high voltage dome, wherein the second vacuum pump is located in the inner pressure vessel, and wherein the following components are not located in the pump pressure vessel: the high voltage dome, the ion source plasma chamber, the extraction component, and the first vacuum pump.

In some embodiments, provided herein are gas removal sub-systems configured to be introduced into a high-energy ion beam generating system having a high voltage dome and an extraction component comprising: a) an exhaust component configured to be located inside the high voltage dome; b) an insulating hose, wherein a first part of the insulating hose is configured to extend through an opening in the high voltage dome; c) a first vacuum pump configured to be located inside the high voltage dome and configured to be operably linked to the exhaust component and the extraction component, wherein the first vacuum pump is configured to remove gas from the extraction component and deliver the gas to the exhaust component; and d) a second vacuum pump located configured to be located inside the high voltage dome and configured to be operably linked to the exhaust component, wherein the second vacuum pump is configured to receive the gas from the exhaust component at a first pressure and deliver the gas to the insulating hose at a second pressure, wherein the second pressure is higher than the first pressure.

In particular embodiments, provided herein are methods comprising: a) providing the system above or otherwise described herein; and b) activating the gas removal sub-system such that gas present in the extraction component is: i) removed by the first vacuum pump to the exhaust component, ii) received by the second vacuum pump from the exhaust component at a first pressure, and delivered to the insulating hose at a second pressure that is higher than the first pressure, and iii) delivered by the insulating hose to atmosphere. In some embodiments, the gas in the extraction component is non-ionized gas that has traveled from the ion source plasma chamber to the extraction component.

In some embodiments, provided herein are systems comprising: a) an outer pressure vessel; b) an inner pressure vessel located inside the outer pressure vessel; c) an exhaust component located inside the outer pressure vessel, wherein a portion of the exhaust component is also located in the inner pressure vessel; d) an insulating hose located inside the outer pressure vessel, wherein a portion of the insulating hose is also located in the inner pressure vessel; e) a first vacuum pump located inside the outer pressure vessel and operably linked to the exhaust component; and f) a second vacuum pump located inside the inner pressure vessel and operably linked to the exhaust component.

In certain embodiments, the outer pressure vessel comprises gas at a higher pressure than gas in the inner pressure vessel. In some embodiments, the gas in the inner pressure vessel is at about atmospheric pressure. In further embodiments, the first vacuum pump is configured to be operably linked to an extraction component of an accelerator system that generates a high-energy ion beam, and wherein the first vacuum pump is configured to remove gas from the extraction component and deliver the gas to the exhaust component. In additional embodiments, the second vacuum pump is configured to receive the gas from the exhaust component at a first pressure and deliver the gas to the insulating hose at a second pressure, wherein the second pressure is higher than the first pressure. In certain embodiments, the system further comprises an extraction component. In further embodiments, the system further comprises an ion source plasma chamber located inside the outer pressure vessel. In some embodiments, the extraction component is operably linked to the ion source plasma chamber.

In some embodiments, provided herein are systems comprising: a) at least one high voltage component that is held at high voltage in an accelerator system that generates a high-energy ion beam, and b) an electrical power component that is electrically linked (and/or mechanically linked) to the at least one high voltage component, wherein the electrical power component provides electrical power to the at least high voltage component (e.g., in a manner that is electrically isolated from ground), wherein the electrical power component comprises a V-belt, and wherein the V-belt comprises a plurality of segments (e.g., 3 . . . 25 . . . 100 . . . 400 segments) and is: i) a poor electrical conductor, or ii) a non-electrical conductor.

In further embodiments, the V-belt comprises a polyester-polyurethane composite. In certain embodiments, the electrical power component further comprises a motor and a power generator. In additional embodiments, the electrical power component further comprises a first V-belt pulley operably attached to the motor, and a second V-belt pulley operably attached to the power generator. In some embodiments, the at least one high voltage component comprises an ion source plasma chamber.

In some embodiments, provided herein are systems comprising: a) an accelerator sub-system that generates a high-energy ion beam, wherein the accelerator system comprises: i) an ion source plasma chamber, ii) a microwave generating component which generates microwaves, iii) a power source operably linked to the microwave generating component, iv) a waveguide positioned to receive the microwaves and deliver them to the ion source plasma chamber, wherein when the microwaves contact a gas in the ion plasma chamber to generate a source of ions; v) an ion beam extraction component that is operably linked to the ion source plasma chamber to extract a low-energy ion beam from the ion plasma chamber, iv) an accelerator component comprising an accelerator column, an accelerator entrance opening for receiving a low-energy ion beam, and an accelerator exit opening for delivering a high-energy ion beam; and b) a power modulating component operably linked to the power source, wherein the power modulating component is configured to modulate power flowing from the power source to the microwave generating component such that the microwaves entering the waveguide are rapidly pulsed and/or extinguished/generated, thereby rapidly pulsing and/or extinguishing/generating the high-energy ion beam. In certain embodiments, the accelerator system is a direct-injection accelerator system. In other embodiments, the microwave generating component comprises a magnetron.

In particular embodiments, provided herein are methods comprising: a) providing the systems described above (and herein), and b) activating the accelerator sub-system and the power modulating component such that the high-energy ion beam is generated and the high-energy ion beam is rapidly pulsed and/or extinguishing/generated.

In some embodiments, provided herein are methods comprising: a) positioning, in a direct-injection accelerator system that generates a high-energy ion beam, an ion beam generating component a first distance from an accelerator entrance of an accelerator column, and b) positioning the an ion beam generating component a second distance from an entrance of an accelerator column, wherein the second distance is different from the first distance, and wherein the second distance improves the performance of the direct injection accelerator system. In certain embodiments, the first and second distances are within the range of 10-500 mm.

In some embodiments, provided herein are systems comprising: a) a direct-injection accelerator sub-system that generates a high-energy ion beam, wherein the accelerator system comprises: i) an ion source plasma chamber, ii) a microwave generating component which generates microwaves, iii) a power source operably linked to the microwave generating component, iv) a waveguide positioned to receive the microwaves and deliver them to the ion source plasma chamber, wherein when the microwaves contact a gas in the ion plasma chamber a ion beam is generated; v) an extraction component that is operably linked to the ion source plasma chamber, iv) an accelerator component comprising an accelerator column and an accelerator entrance opening for receiving the ion beam; and b) a vacuum component, wherein the vacuum component is operably linked to the extraction component and/or the accelerator component, wherein the vacuum component is configured to reduce pressure in the extraction component and/or the accelerator component. In particular embodiments, the reduction in pressure is at a level that reduces the diameter of the high-energy ion beam.

In some embodiments, provided herein are methods comprising: a) providing the systems described above (and herein), and b) activating the direct-injection accelerator sub-system and the vacuum component such that the high-energy ion beam is generated such that the high-energy ion beam has a smaller diameter than it would have in the absence of the reduction in pressure.

In some embodiments, provided herein are systems comprising: a) an accelerator sub-system that generates a high-energy ion beam, wherein the accelerator system comprises: i) a high voltage dome; ii) an ion beam generating component which is located inside the high voltage dome, and iii) an accelerator component comprising an accelerator column; and b) a water resistor sub-system comprising: i) a water circulating component comprising water piping and a water reservoir, ii) a water resistor element that runs along the accelerator column, wherein the water resistor element comprises electrically non-conductive and/or insulated tubing fluidically linked to, or integral with, the water piping such that controlled conductivity water circulating in the water circulating component passes through the water resistor element.

In certain embodiments, the system further comprises the controlled conductivity water, wherein the controlled conductivity water comprises: i) deionized water, 2) deionizing (DI) resin, and a metal salt. In further embodiments, the accelerator component further comprises a plurality of grading rings that run along the accelerator column. In additional embodiments, the insulating tubing comprises a material selected from the group consisting of: polycarbonate, polymethyl methacrylate (PMMA), and polyethylene. In further embodiments, the water circulating component further comprises a water pump, a heat exchanger and/or a DI resin source component. In some embodiments, the controlled conductivity water contains a sufficient amount of the DI resin such that the deionized water has a resistivity of 15 Megohm-cm or higher. In further embodiments, the metal salt is selected from the group consisting of: copper sulfate, sodium chloride, ammonium chloride, magnesium sulfate, and sodium thiosulfate. In further embodiments, the water resistor element is able to withstand voltages of up to about 300 kV DC, and reject up to about 30 kW, or up to about 3 kW, or up to about 5 kW, of heat.

In particular embodiments, provided herein are methods comprising: a) providing the systems above (and as described herein), and b) activating the accelerator sub-system and the water-resistor sub-system such that, while the high-energy ion beam is generated, the controlled conductivity water circulates through the water circulating component and the water-resistor element performs as an electrical resistor along the accelerator column.

In other embodiments, provided herein are systems comprising: a) at least one high-voltage power supply (HVPS) configured to deliver power to a component of an accelerator sub-system that generates a high-energy ion beam; and b) a water resistor sub-system comprising: i) a water circulating component comprising water piping and a water reservoir, and ii) a water resistor element comprising an electrically non-conductive and/or insulated tubing fluidically linked to, or integral with, the water piping such that controlled conductivity water circulating in the water circulating component passes through the water resistor element.

In particular embodiments, provided herein are methods comprising: a) providing the systems described above (and as described herein), and b) testing the at least one HVPS using the water resistor sub-system as a test load.

In some embodiments, provided herein are methods of designing lenses comprising: a) entering the following parameters at the plasma lens aperture of an accelerator system into a software application: beam current, extraction voltage, ion species fractions, maximum electric field, and ion current density; b) receiving an output from the software for a design of at least one lens in an electrostatic lens stack, wherein the electrostatic lens stack comprises: a plasma lens, an extraction lens, a suppression lens, and an exit lens; and c) fabricating the at least one lens based on the output. In certain embodiments, the software application comprises the PBGUNS software application. In further embodiments, the at least one lens comprises at least two, at least three, or all four of the lenses in the electrostatic lens stack. In further embodiments, the methods further comprise entering at least one of the following into the software application: grid precision, an empirically determined beam neutralization factor, and the electron and ion temperatures in the source plasma.

In some embodiments, provided herein are systems (e.g., for use in, or part of, a high energy ion beam generator system) comprising an extraction lens stack having a plurality of insulating balls (e.g., alumina ceramic, aluminum nitride, sapphire, diamond, or other oxide or non-oxide ceramic balls) positioned between lens gaps of the extraction lens stack. In some embodiments, a minimum of three insulating balls are positioned between each lens gap. In some embodiments, the three insulating balls are spaced evenly in azimuthal coordinate. In some embodiments, the lens stack is held together with metal bolts. Further provided herein are methods of generating neutrons and protons using such systems so as to provide, for example, enhanced mechanical stability, beam quality, and protection of source and beamline components, while increasing the total current that can be reliably transported to the target of interest.

In some embodiments, provided herein is a system (e.g., for use in, or part of, a neutron generator system) comprising: a) a high power density solid target comprising a reactive species (e.g., reactive hydrogen species such as deuterium or tritium) embedded in a solid matrix; and b) a cooling component. The solid matrix may be made of any desired material including, but not limited to, titanium.

In some embodiments, the cooling component is a closed-loop component. In some embodiments, a coolant flow pathway is integrated into the solid target. In some embodiments, the system further comprises a source of coolant, providing coolant that is flowed through the cooling component. In some embodiments, the coolant is selected from the group consisting of water, glycol (e.g., (poly-)ethylene glycol), oil, helium, or the like. In some embodiments, the closed-loop component comprises a deionization sub-component to deionize coolant flowing therethrough. In some embodiments, the closed-loop component comprises a filtering sub-component to filter coolant flowing therethrough. In some embodiments, the coolant component comprises a chiller positioned to pre-cool coolant prior to contact with the target.

In some embodiments, the target is manufactured with a thin wall so as to maximize the impact of the coolant. In some embodiments, the wall has a thickness of 0.02 inches or less (e.g., 0.01 inches). In some embodiments, the wall is composed of a material selected from the group consisting of copper, silver, gold, diamond, diamond like carbon, or a combination thereof.

In some embodiments, the target comprises a pathway with convolutions to increase surface area relative to a target lacking the convolutions. In some embodiments, the convolutions are fins or ribs or combinations thereof.

In some embodiments, the cooling component is configured for laminar flow of coolant. In some embodiments, the cooling component comprises channels having irregular surface features (e.g., dimples, spiraled indentions, or combinations thereof). In some embodiments, the cooling component is configured for turbulent flow of coolant, with channels having irregular surface features (e.g., dimples, spiraled indentions, or combinations thereof).

Method of employing such systems are also provided. For example, in some embodiments, a method of generating neutrons with a high power density solid target is provided by using any of the above systems. In some embodiments, the method involves depositing an ion beam's energy into a small volume.

In some embodiments, provided herein is a system (e.g., for use in, or part of, a neutron generator system) comprising: a) a solid target; b) a vacuum system; and c) a source of a noble gas in fluid communication with the vacuum system and configured to release noble gas near the solid target. In some embodiments, the noble gas is argon. Further provided herein are methods of cleaning a neutron generator solid target comprising: exposing the solid target to a noble gas (e.g., while the solid target is exposed to an ion beam). In some embodiments, the noble gas is flowed at 1 to 10 standard cubic centimeters per minute.

In some embodiments, provided herein is a system (e.g., for use in, or part of, a neutron generator system) comprising: a) an accelerator that produces an ion beam; b) a target (e.g., gas target) positioned to be contacted by the ion beam; c) a target aperture separating the accelerator and the target; d) a focusing component that focuses the ion beam to the aperture; and e) a plurality of thermal sensors positioned near an upstream-facing surface of the target aperture. In some embodiments, the plurality of thermal sensors comprises four thermal sensors equally spaced at 90 degree intervals about an axis of the aperture. In some embodiments, the thermal sensors comprise thermocouples (e.g., copper-constantan thermocouples). In some embodiments, the thermal sensors are platinum resistance temperature detectors (RTDs), thermistors, or semiconductor temperature sensors.

In some embodiments, the system further comprises a processor that receives temperature signals from the sensors. In some embodiments, the processor sums temperature signals from the sensors and generates an average target aperture temperature. In some embodiments, the processor adjusts the ion beam position based on the average target aperture temperature to minimize the temperature of the target aperture.

Further provided herein are methods of steering an ion beam to a target aperture in a neutron generator system comprising: a) measuring temperature at a plurality of locations around said target aperture; and b) steering the position of the ion beam to minimize temperature at the target aperture (e.g., using the above systems).

In some embodiments, provided herein is a system (e.g., for use in, or part of, a neutron generator system) comprising: a) an accelerator that produces an ion beam; b) a target (e.g., gas target) positioned to be contacted by the ion beam; c) a target aperture separating the accelerator and the target; and d) a reverse gas jet that increases pressure differential across the aperture. In some embodiments, the reverse gas jet comprises a throat gap, a nozzle having a nozzle angle and nozzle length, and a plenum. In some embodiments, the reverse gas jet comprises a nozzle that diverges after it converges. In some embodiments, the reverse gas jet comprises a nozzle aperture of approximately 3/8 inch. In some embodiments, the reverse gas jet comprises a throat gap of less than 0.01 inch. In some embodiments, the reverse gas jet comprises a nozzle angle of 12.5 degrees. Further provided herein are methods of increasing a pressure differential across a target aperture of a neutron generator comprising employing a reverse gas jet at the target aperture.

In some embodiments, provided herein is a system (e.g., for use in, or part of, a neutron generator system) comprising a beam scraper wherein the beam scraper is moveable into a path of an ion beam using a motor, wherein the motor is mounted to the generator system outside of a vacuum vessel containing the target. In some embodiments, the motor is connected to the beam scraper via a magnetically coupled vacuum feedthrough (e.g., linear motion feedthrough). In some embodiments, the motor, beam scraper, and connections there between are all-metal with brazing manufacture. Further provided herein are methods of blocking a fraction of an ion beam hitting a target in a neutron generator, comprising: moving a beam scraper into a position contacted by the ion beam using a motor that is mounted to the generator outside of a vacuum vessel containing the target.

In some embodiments, provided herein is a system comprising: a) a high energy ion beam generator device having a first interlock; and b) a user control station having a second interlock, wherein the high energy ion beam generator and the user control station are connected via a fiber optic interlock comprising a plurality of normally-closed switches in a series loop that remain closed to indicate that the generator is safe to operate, a number of normally-open switches in a parallel loop that remain open to indicate that the generator is safe to operate, or both the series loop and said parallel loop. In some embodiments, the high energy ion beam generator and the user control station are electrically isolated from one another. In some embodiments, the fiber optic interlock comprises a frequency generator. In some embodiments, the frequency generator triggers a fiber-optic transmitter causing light to pulse at a set frequency. In some embodiments, the system is configurable among a plurality of distinct frequencies, for example, for the purpose of having multiple channels with non-interoperability between channels to prevent erroneous cross-connection. In some embodiments, the system comprises control software that manages the fiber optic interlock. In some embodiments, the control software operates a multiple-signal verification procedure of the fiber optic interlock. Methods of using such a system are also provided. In some embodiments, the method comprises transmitting information via the fiber optic interlock to or from the high energy ion beam generator and user control station to the other.

In some embodiments, provided herein is a system (e.g., for use in, or part of, a high energy ion beam system) comprising: a) a high energy ion beam generator device that produces a beam, and b) a damage mitigation component, the damage mitigation component comprising: i) a plurality of sensors positioned on the device and configured to monitor a plurality of regions of that device that may interact with the beam; and ii) control software in communication with the plurality of sensors and configured to generate an alert or alarm and adjust the device in response to the alert or alarm. In some embodiments, one or more of the sensors measures temperature of a region of the device. In some embodiments, one or more of the sensors measures coolant (e.g., water) flow rate. In some embodiments, one or more of the sensors are in continuous sensing mode. In some embodiments, one or more or all of the sensors has associated therewith a threshold value that if exceeded generates the alert or alarm. In some embodiments, the alert comprises a user warning. In some embodiments, the alarm triggers a device shut down or reset. In some embodiments, the alarm is a latching alarm that requires a user to reset the device prior to further operation. In some embodiments, the control software filters out background EMI. In some embodiments, the filtered background EMI is under a predefined threshold duration or frequency to differentiate it from a potentially harmful event. Methods of using the system are also provided. In some embodiments, methods comprise detecting potential damage events using the system. In some embodiments, the methods comprise generating an alert or alarm and desired associated response (e.g., warning, automatic system shut down, etc.).

In some embodiments, provided herein is a system (e.g., for use in, or part of, a high energy ion beam generating system) comprising: a) a high energy ion beam generator device, and b) an arc down mitigation component, the arc down mitigation component comprising: i) a plurality of sensors positioned on the device and configured to monitor conditions consistent with an arc down event; and ii) control software in communication with the plurality of sensors and configured to generate an alert or alarm and adjust the device in response to the alert or alarm. In some embodiments, the alarm triggers an automated recovery sequence that returns the device to normal operation without user intervention. Methods of using the system are also provided. In some embodiments, methods comprise responding to arc down events using the system.

In some embodiments, provided herein is a high energy ion beam generator system comprising a closed-loop control component that manages high voltage power supply (HVPS) setpoint. In some embodiments, the component also controls one or more other system functions including but not limited to microwave power, focus, and steering. In some embodiments, provided herein are methods for controlling high energy ion flux output variability in a high energy ion beam generator comprising: managing high voltage power supply (HVPS) setpoint with a closed-loop control component.

In some embodiments, provided herein is a neutron guidance system for use in neutron radiography comprising a collimator comprising a high density polyethylene (HDPE) layer, a borated polyethylene layer, a metal layer (e.g., comprising aluminum and/or lead layers), and a cadmium layer.

In some embodiments, provided herein is system for neutron radiography comprising one or more or all of: a) a neutron source (e.g., a source of 2.45 MeV neutrons); b) a high density polyethylene (HDPE) layer, a borated polyethylene layer, a metal layer (e.g., comprising aluminum and/or lead layers), and a cadmium layer; c) a detector; d) a moderator (e.g., a graphite moderator and/or a $D_2O$ moderator); and e) underground shielding (e.g., comprising soil, concrete, or other protective layers). In some embodiments, the system comprises an offset collimator that does not directly align with a fast neutron source.

Further provided herein are methods of imaging a sample comprising: exposing a sample to neutrons generated by the above systems.

In some embodiments, provided herein are systems and methods for semiconductor manufacturing. In some embodiments, the system comprises an accelerator system that generates a high-energy ion beam (e.g., hydrogen ion beam) as described here having the beam directed at a component holding semiconductor material. In some embodiments, the method comprises contacting a semiconductor material with protons generated from a high energy ion beam generator system described herein. In some embodiments, the method further comprises the step of generating a thin film wafer by cleaving the semiconductor material (e.g., at a cleave site formed by implanted hydrogen ions). In some embodiments, the method further comprises the step of fabricating a photovoltaic (PV) wafer from the thin film wafer. In some embodiments, the method further comprises the step of fabricating a solar panel comprising the photovoltaic wafer. In some embodiments, the method further comprises the step of fabricating a light emitting diode (LED) comprising the photovoltaic wafer. In some embodiments, the method comprises the step of fabricating a light emitting diode (LED) from the thin film wafer.

BRIEF DESCRIPTION OF THE DRAWINGS

FIG. 3A shows a top: section view, while FIG. 3B shows an electric field at each step.

FIG. 4A shows a top: section view, while FIG. 4B shows an electric field at each step.

DETAILED DESCRIPTION

Figure 1:
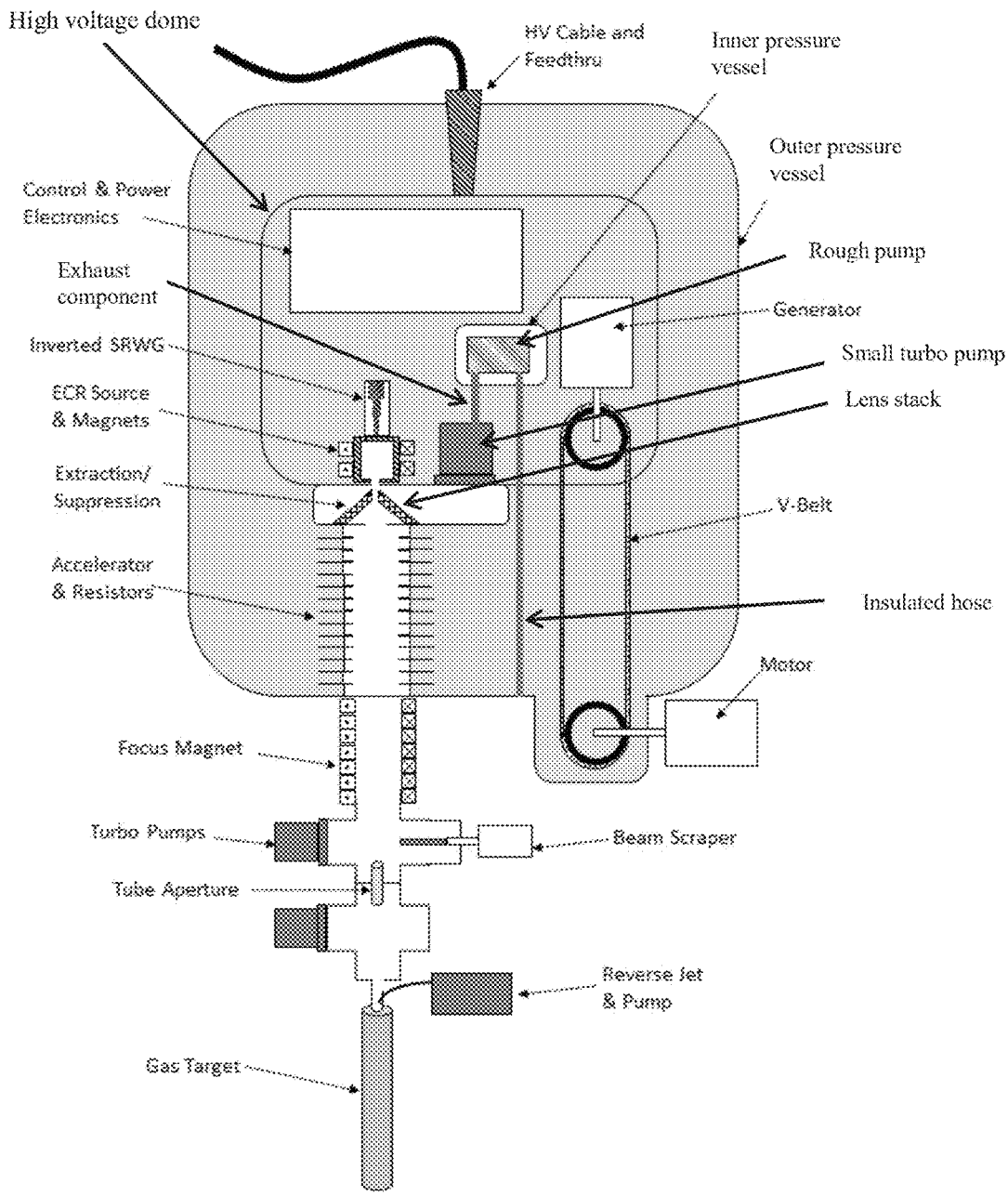
FIG. 1 shows an exemplary schematic of an accelerator system where the target is a gas target.
Figure 2:
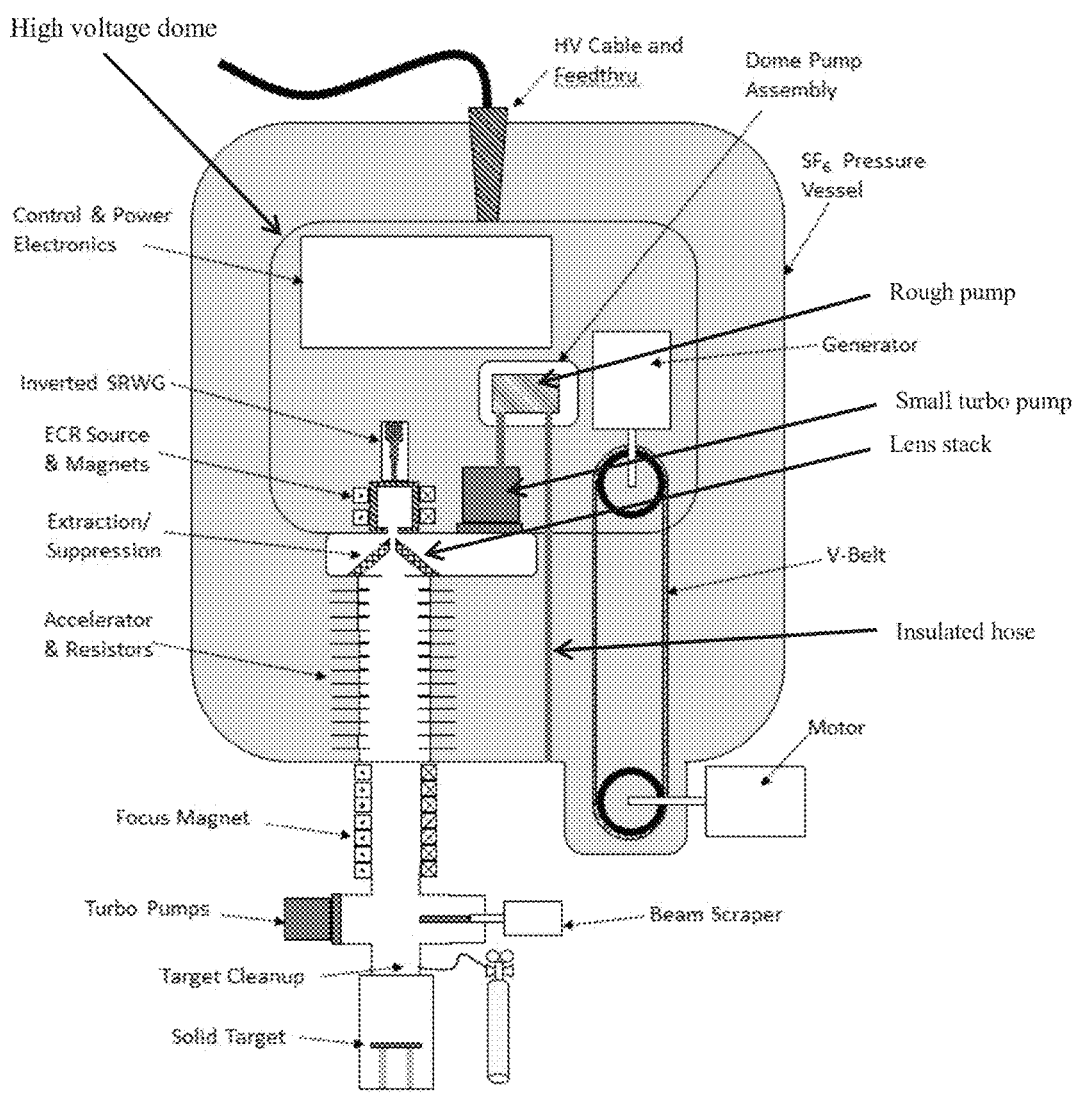
FIG. 2 shows an exemplary schematic of an accelerator system where the target is a solid target.

Exemplary components of the accelerator system are described in more detail in the following sections: I. Ion Source; II. Infrastructure; III. High Voltage Systems; IV. Neutron Producing Target; V. Automated Control Systems; VI. Diagnostics; and VII. Uses for Accelerator Systems.

I. Ion Source

The ion source provided herein includes a number of components including: a plasma chamber microwave waveguide feed; an operational parameter optimization technique; the source magnet mounting mechanism; and the use of brazing for manufacturing water-cooled beamline components). Each of these improvements will be discussed in turn.

A. "Inverted" Waveguides

Provided herein are waveguides that contained inverted impedance matching components (e.g., inverted in the sense that the stepped ridges are mounted in the center of the waveguide rather than being incorporated into the external structure) that help prevent the back-flow of electrons when positioned between an electronic magnetic wave source (e.g., microwave source) and a plasma chamber (e.g., as part of a larger accelerator system). The inverted impedance matching components are generally seen to be "inverted" or "inside-out" with respect to the conventional prior art impedance matching technique, as the inverted components, in certain embodiments, extend progressively outward from the midplane of the waveguide toward the broader walls (FIG. 4). In certain embodiments, the inverted waveguides comprises a device comprising: a) a waveguide comprising: i) a proximal end comprising an electromagnetic wave entry point, ii) a distal end comprising an electromagnetic wave exit point, and iii) outer walls extending between the proximal end and the distal end and configured to propagate electromagnetic waves; and b) an inverted impendence matching component located inside the waveguide component, wherein the inverted impedance matching component extends from the distal end of the waveguide to at least partway towards the proximal end of the waveguide, and wherein the inverted impedance matching component comprises a distal end and a proximal end, wherein the distal end of the impedance matching component is located at or near the distal end of the waveguide and has a greater cross-sectional area than the proximal end of the inverted impedance matching component.

In a microwave ion source, a plasma chamber is supplied with the desired gas (e.g., hydrogen, deuterium, etc.), a magnetic field, and microwave power. The microwaves are delivered to the plasma chamber through a waveguide entering the chamber at the end opposite the beam exit aperture. The magnetic field is shaped so that the electron cyclotron resonance (ECR) condition is satisfied near the beam exit aperture, i.e., the electron cyclotron frequency at that location matches the frequency of the applied microwaves. For example, $$\omega_{ce} = \frac{qB}{m}$$

where q is the electron charge, B is the magnetic flux density and m is the mass of the electron. Due to the magnetic field geometry, the microwave power may also be absorbed in an ECR region within the waveguide before it reaches the plasma chamber. This is prevented by keeping the waveguide under vacuum and using a ceramic disk to separate it from the gas in the plasma chamber. In the art, waveguides may include a mechanism for impedance transformation in the form of a pair of stepped ridges increasing in extent from the broad faces of the guide to reach their maximum extent at the ceramic disk, designed to reduce the impedance mismatch between the waveguide and the plasma in the source chamber (see FIG. 3).

By way of background, electrons created in the extraction and acceleration regions of an accelerator system can enter the ion source plasma chamber through the ion beam exit aperture and impact the ceramic insulator at the opposite end of the plasma chamber at high energies. If these electrons burn a hole through the insulator, the working gas in the plasma can flow into the waveguide, where it can absorb microwaves, resulting in plasma formation in this region. This reduces the microwave power available for driving the ion source plasma, affects the stability of the ion source and lowers the maximum extractable beam current. If the hole in the ceramic becomes large enough, overheating of the waveguide may also damage that component, affecting the reliability and lifetime of the overall system.

The inverted waveguides described herein (e.g., FIG. 4) are designed to intercept back-streaming electrons which may perforate the ceramic disk, which would otherwise lead to plasma formation in the waveguide, reducing the plasma density in the source chamber and the beam current due to loss of microwave power, while possibly damaging the waveguide due to excessive heating. In certain embodiments, a hole is provided in the ceramic disk such that the electrons do not perforate the disk by damaging it, and directly impact the impedance matching component by design.

Figure 3A:
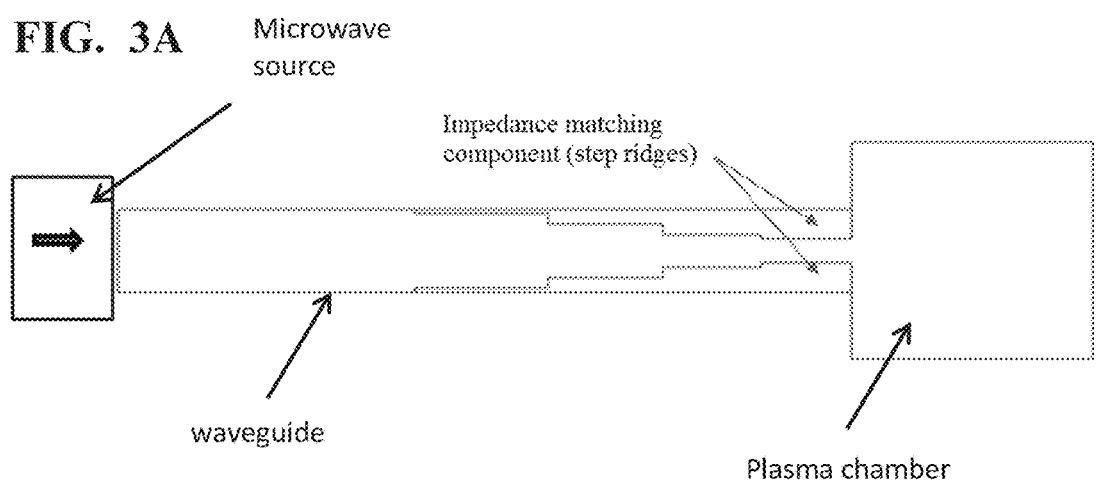
FIG. 3A-B shows known waveguide designs, with metal impedance matching components (two step ridges are shown) that each extend inward from a broader face of the waveguide in the direction of its narrower dimension.
Figure 3B:
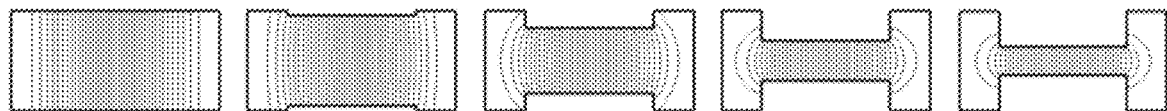

Therefore, in some embodiments, provided herein inverted impedance matching components (e.g., water-cooled metal surfaces) located to intercept the back-streaming electrons without damage while efficiently coupling microwave power into the plasma chamber. The known design of the waveguide step ridges is conventional in that they are electrically and mechanically attached to the outer waveguide walls, extending symmetrically into the guide from the center of its broad faces, and extending for a portion of the width of the guide, as shown in FIG. 3. Due to the orientation and symmetry of the fields in the waveguide, in certain embodiments, it is possible to divide it in half along the midplane between the ridges and transpose the two halves across the midplane, as illustrated in FIG. 4. This symmetry applies at each step of the ridges, and maintains the electrical performance of the stepped design to match the impedance of the waveguide to the plasma chamber. Other approaches may be used to invert the typical orientation of the impedance matching components in a waveguide.

The resulting inverted types designs provided herein, provides a substantial mass of metal in the path of back-streaming electrons on the axis of the plasma chamber (see large cross-sectional area in FIG. 4B, right most section), which is supported from the sides of the chamber by a supporting component which is in a low field region and so does not perturb the microwave propagation. These support components (e.g., legs) may be, for example, solid metal for low power applications or may be hollow tubes for water cooling the impedance matching component, which may be, for example, in the form of discrete steps as shown or may take the form of a smoothly tapering shape.

Figure 4A:
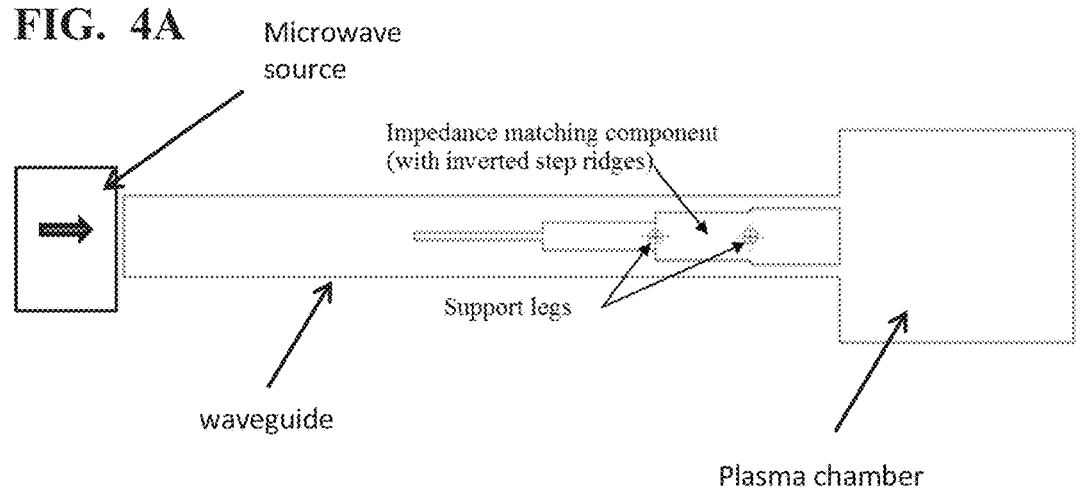
FIG. 4A-B shows an exemplary waveguide design of the present disclosure, with inverted impedance matching components which extend progressively outward from the midplane of the waveguide toward the broader walls of the waveguide.
Figure 4B:
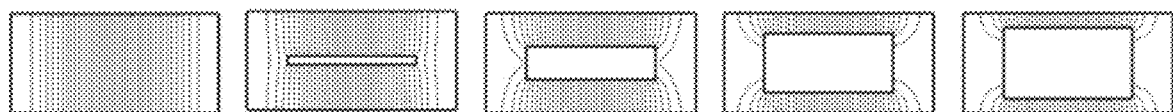

In certain embodiments, two sets of support legs are used, as shown in FIG. 4A, with a separation such that the reflection of microwave power away from the plasma chamber by one support leg is largely cancelled out by the power reflected by the other support leg, with the second reflection having equal wave magnitude and opposite wave phase. Alternatively, in some embodiments, a single support leg may be used if the reflection magnitude is insignificant in a low power application.

In certain embodiments, the face of the impedance matching component on which the back-streaming electrons are incident may be fitted with a refractory metal insert for high power applications as needed, or left as a lower melting high thermal conductivity metal in low power applications.

In the prior art, the impedance matching component (e.g., which may be composed of the two sets of metal steps ("step ridges")) each extend inward from a broader face of the waveguide in the direction of its narrower dimension (FIG. 3) each half of which is translated inward by half the narrow dimension of the waveguide.

B. Operational Parameter Optimization

In certain embodiments, the accelerator systems or sub-systems, described here are optimized to improve performance. In general, accelerator system are composed of a large number of coupled nonlinear subsystems. These include, but are not limited to: ion source magnet position and current, ion source microwave power, ion source gas flow, beam extraction voltage, accelerator voltage, focus solenoid current, steering magnet current, and gas target pressure. This full system is generally too complex to directly model or predict a priori. Additionally, small differences between individual instances of the system, for example the alignment of the beamline, can have large effects on system performance and are difficult to incorporate into predictive models. As such, final system optimization normally relies on empirical results. This process generally requires a skilled and experienced operator to obtain peak performance of the system and involves risk of damage to components due to operator error. Embodiments of the present disclosure address these problems by providing automated and partially automated processes for optimization.

Figure 5:
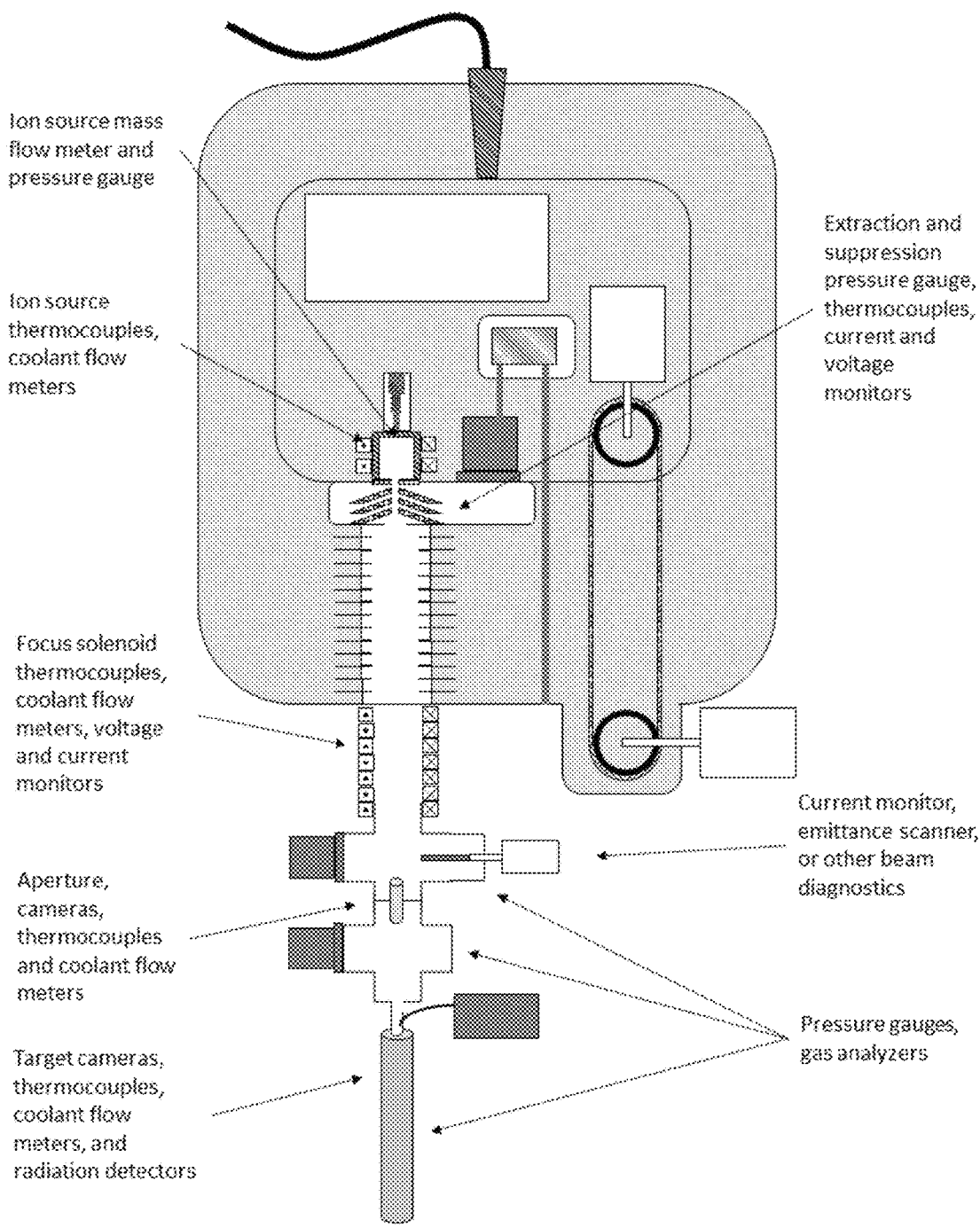
FIG. 5 shows an exemplary layout of telemetry and diagnostics in an accelerator system.

An automated process for final optimization of the system provides repeatable performance while minimizing risk of damage and eliminating the need for a skilled operator. In certain embodiments accelerator systems or sub-systems may include one or more protection/monitoring components including, but not limited to, thermocouples, cameras, and voltage and current monitors automatically assess the state of the system and prevent the system from operating in a state which may damage components during this optimization process. FIG. 5 provides exemplary protection and monitoring components, including: an ion source mass flow meter and pressure gauge; an ion source thermocouple and coolant flow meter; a focus solenoid thermocouple, coolant flow meter, voltage monitor, and current monitor; aperture cameras, thermocouples, and coolant flow meters; target cameras, thermocouples, coolant flow meters, and radiation detectors; extraction and suppression pressure gauge, thermocouples, current monitors, and voltage monitors; beam diagnostic components such as current monitors and emittance scanners; pressure gauges; and gas analyzers.

Figure 6:
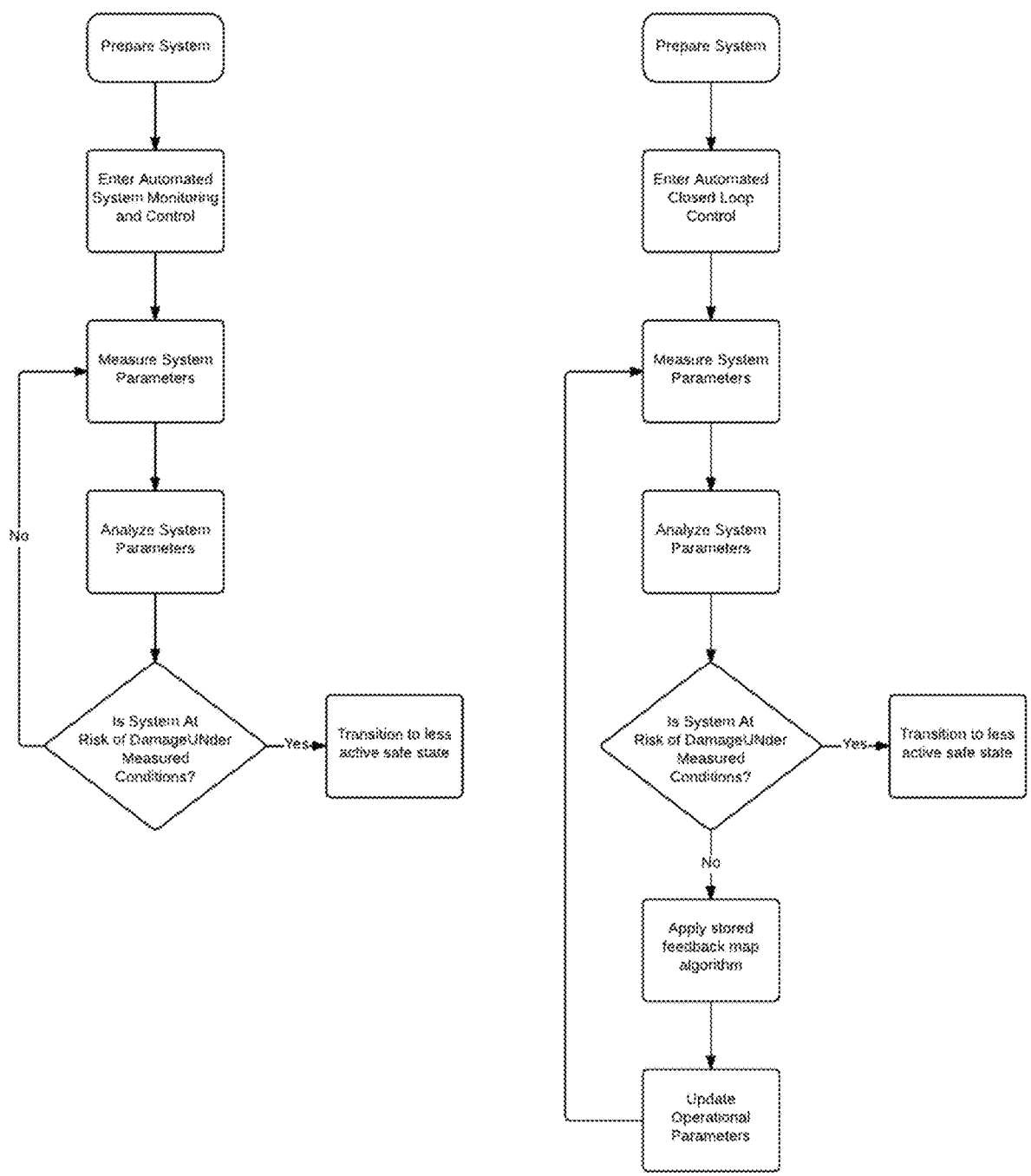
FIG. 6 shows an exemplary flowchart for automated mapping (left) and closed loop feedback (right).

In certain embodiments, these monitoring components communicate with a central computer running control software, which allow automatic adjustments to the monitored accelerator system components. For example, during this process, one or more system parameters is automatically controlled and adjusted while the relevant system outputs are monitored. This allows the operational phase space of the individual system to be mapped out. Such a map allows the most stable operational points to be found over the entire range of the system. Once mapped, the control system can use closed-loop PID (proportional-integral-derivative) algorithms automatically to return to these stable operating points as necessary, and without the need for a skilled operator. One example of the computer implement control logic is shown in FIG. 6, which provides feedback from monitoring components to a central computer system to prevent parts of the accelerator system from operating at conditions that could damage various components.

Figure 7:
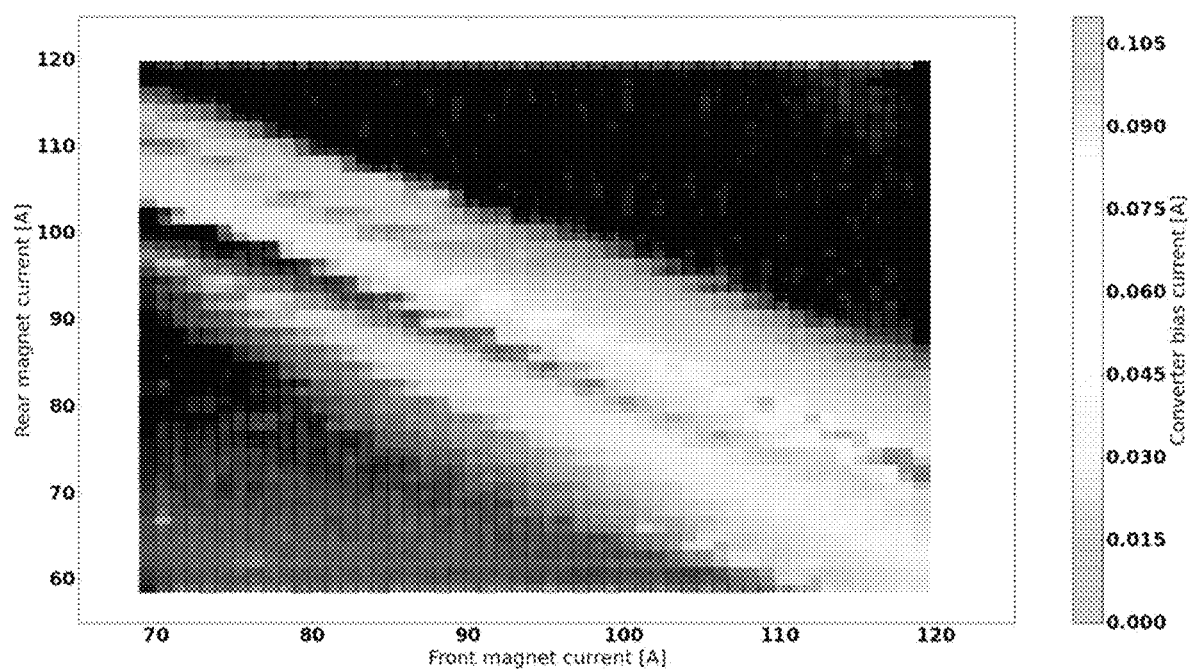
FIG. 7 shows an example of 2D slice of the ion source operational phase space mapped by automatic algorithms.

In some embodiments, the ion source sub-system is monitored with monitoring components. Initially, prior to implementing the monitoring components, each parameter such as ion source magnet position and current, ion source microwave power, ion source gas flow, and extraction voltage was manually adjusted individually while performance metrics such as the beam current were recorded. This resulted in a limited mapping of the operational phase space. This manual process was time-consuming and only a small subset of the operational space could be explored in a reasonable period. Manual methods are also prone to damaging components, especially when automated health-monitoring and interlocking systems are not implemented. To begin to address these limitations, algorithms (such as those in FIG. 6) were developed to post-process and mine data collected during such manual optimization runs to map the operational phase space, as illustrated by an example shown in FIG. 7. This partial automation improved the efficiency and repeatability of the process but does not allow for real-time results while the system is operating. In certain embodiments, monitoring components are employed to track prolonged operation at given setpoints to collect long term stability statistics can also be incorporated into the system to quantitatively determine the most stable operational points.

C. Magnet Concentration/Mounting

Figure 8:
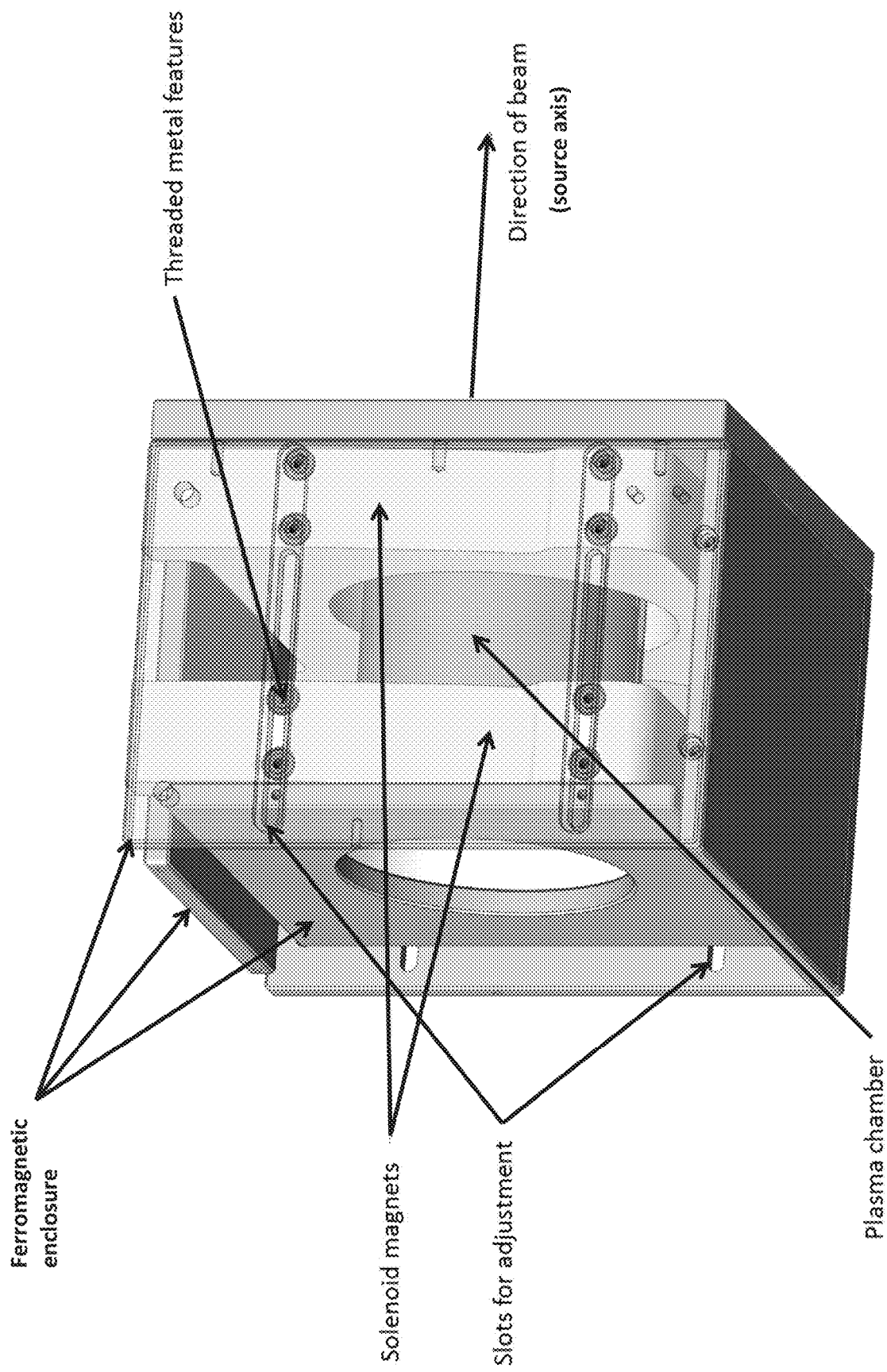
FIG. 8 provides an exemplary embodiment of an adjustment system for adjusting and fixing solenoid magnets that surround an ion source plasma chamber.

The precise magnetic field profile in the ion source is an important factor for properly coupling microwave power into the plasma, so small physical movements of the ion source magnets can cause large changes in the source performance. Therefore, provided here are adjustment systems and components to adjust and fix the location of these magnets, as required for testing and optimization, as well as to account for subtle variations from system to system. One exemplary embodiment of an adjustment system for adjusting and fixing solenoid magnets that surround a ion source plasma chamber is shown in FIG. 8. In this embodiment, each ion source solenoid magnet is encased in epoxy, which is used to rigidly bond the magnet to one or more attachment components (e.g., threaded metal features). The magnets are located inside a ferromagnetic enclosure that concentrates the magnetic field in the ion source region and shields the source from any external fields. The ferromagnetic enclosure has slots along its sides, allowing for the attachment of bolts from outside the enclosure to the threaded metal features of each magnet assembly. The location of each magnet along the axis of the source axis can thus be adjusted by moving the bolts along the slots and fixed in place by tightening the bolts against the enclosure. Thus, provided herein are reliable and relatively low cost methods and systems for both positioning and fixing the ion source solenoid magnets in place.

D. Brazing and Water Cooling

In certain embodiments, provided herein are metallic assemblies (e.g., composed of low conductance metal) that when positioned in an accelerator system: partially intercept the high-energy ion beam, wherein the metallic assembly comprises: i) at least one water cooling channel, and ii) a first metal component, a second metal component, and filler metal, wherein said filler metal attaches said first metal component to said second metal component at a joint (e.g., a brazed joint).

In configurations (e.g., with a gaseous target) large pressure differentials across the vacuum system are maintained by low-conductance metallic apertures that limit the flow of gas from the target to the beamline. The high-energy ions in the edge region of the ion beam deposit large amounts of energy on the aperture, which can lead to excessive heating and permanent damage.

Figure 9A:
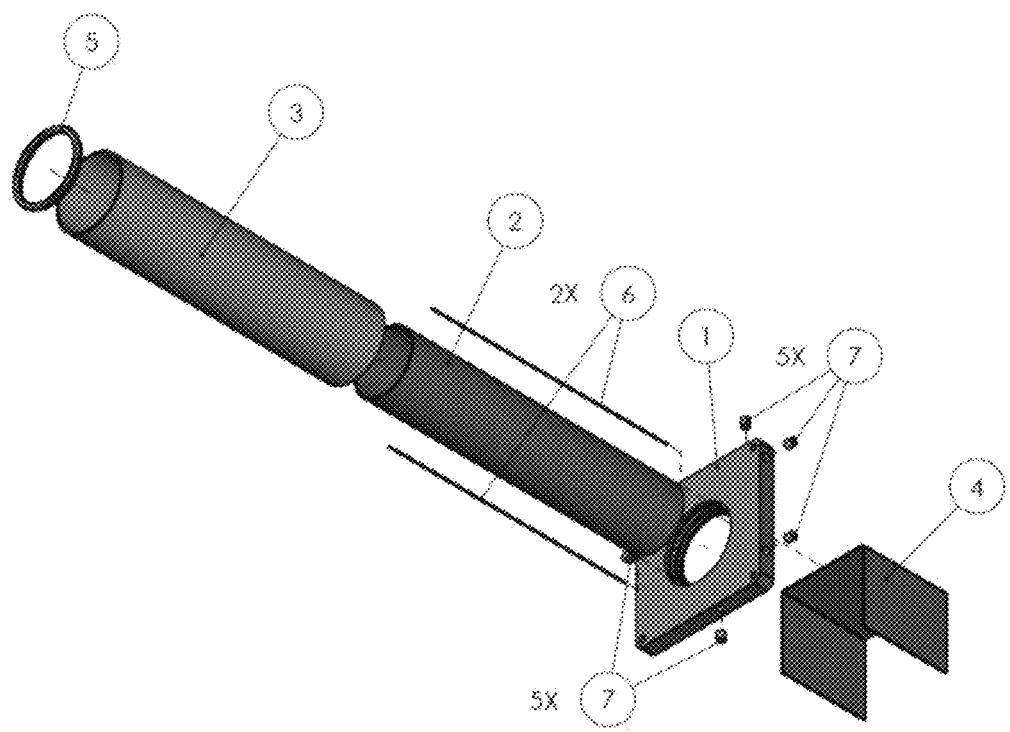
FIG. 9A shows an exemplary differential tube assembly, with parts that are brazed together.
Figure 9B:
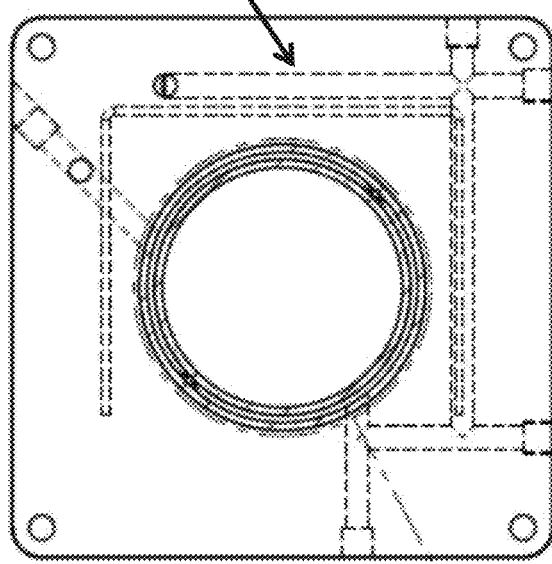
FIG. 9B shows a see-through view of an exemplary differential tube plate, showing water channels located therein.
Figure 9C:
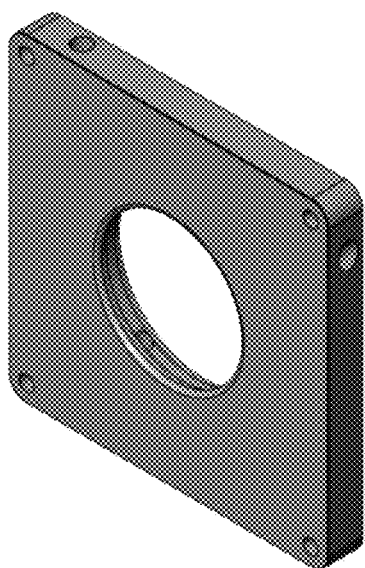
FIG. 9C shows a perspective view of an exemplary differential tube plate.

FIG. 9A shows an exemplary differential tube assembly, with parts that are brazed together. FIG. 9A shows the following parts: a differential tube plate (1); a first differential tube (2); a second differential tube (3); a turbo shadow (4); an aperture tube cap (5); a pair of aperture tube rods (6); and a plurality of plate plugs (7). FIG. 9B shows a see-through view of an exemplary differential tube plate, showing water channels located therein. FIG. 9C shows a perspective view of an exemplary differential tube plate.

Work conducted during development of embodiments disclosed herein identified water cooling as an efficient way to remove heat from metallic parts that may partially intercept the beam. Due to the beam's high power density and the vacuum environment that the beam and these components are in, special considerations must be taken into account when implementing the water cooling.

The reliability of the system has been found to significantly improve by using highly thermally conductive metals (e.g., copper, aluminum) to fabricate components that may be impacted by the beam, and by adding water cooling channels to these parts to prevent them from melting. These components often need to have complex shapes and highly thermally conductive materials are difficult to weld, so brazing has been determined to be the best method to join pieces together while leaving spaces for the water to flow in. This not only allows the water channel shape to be complex and reach all the important areas, but also creates a strong, full penetration joint that maintains the high thermal conductivity of the base metal. While more expensive than some other techniques, it provides high reliability against water leaks, which are very problematic for water-cooled parts that are in a vacuum.

In it is noted that initially, in work conducted during development of embodiments described herein, these components were made out of copper, tungsten, aluminum or stainless steel, but without cooling, so they did not survive for long periods, even though they only intercepted the edge of the beam. Water cooling channels were later added and were sealed with NPT plugs, but the temperatures were high enough to decompose polymers, so that the thread sealant was not effective at preventing leaks into a high-vacuum environment. O-rings have similar issues with elevated temperatures. Brazing metal plugs into position (e.g., to fill the holes drilled to create water channels), is a superior solution. In certain embodiments, rather than, or in addition to water channels, heat pipes are employed to remove waste heat. In particular embodiments, the overall accelerator system's reliability is improved by using brazed assemblies with water cooling channels, as there may be fewer leaks which can damage other expensive equipment, such as vacuum pumps.

II. Ion Source Infrastructure

In certain embodiments, the ion source infrastructure has a number of improvements that contribute to its improved behavior. These include, for example: the implementation of vacuum pumping at high voltage; nesting pressure vessels for operation of certain components at high voltage; and the use of a V-belt for power transmission to components at high voltage. Each of these improvements will be discussed in turn.

A. Vacuum Pumping at High Voltage

A fraction of the gas fed into the plasma chamber is not ionized by the microwaves and drifts into the extraction and acceleration regions where strong electric fields are applied. The presence of neutral gas usually increases the likelihood of high-voltage arcs, which can disrupt the operation of the system, triggering fault states in the high-voltage power supplies and degrading the lifetime of beamline components. Furthermore, ions in the beam can undergo atomic and molecular processes with the background neutral gas, such as scattering or charge exchange events, which deteriorate the beam quality or reduce the ion current.

In light of these issues, provided herein are systems and methods that allow removal of the non-ionized gas from the extraction region. In certain embodiments, the ion source region is designed to allow for mounting a first vacuum pump (e.g., small turbomolecular vacuum pump) directly on the ion source, inside the high-voltage dome, to remove gas entering the extraction region from the plasma source. However, the exhaust from the vacuum pump cannot be released into the high-pressure, insulating-gas-filled enclosure in which the ion source resides. In order to solve this secondary problem, the vacuum pump exhaust is compressed to higher pressure with a second vacuum pump (e.g., small roughing pump), and then passed into an insulating hose that is run between the high-voltage end and ground. In certain embodiments, the insulating hose is wound in a helix shape to increase its voltage breakdown rating. At the ground end, the gas is released to the atmosphere like a regular vacuum pump system. Pumping the exhaust gas across high voltage is uncommon and the solution is counter-intuitive due to the difficulty of implementation, but it permits the removal of gas from the extraction and acceleration regions when using an insulating-gas-filled enclosure. Pumping directly on the ion source region removes most of the leakage gas from the plasma source, reducing the pressure in the extraction region. This increases the maximum voltage that can be used, reduces arcs, increases long-term reliability and allows for better beam quality. It also permits the ion source region to be designed without regard to gas flow requirements, increasing design flexibility.

It is noted that prior art designs used vacuum pumps at the ground end of the accelerator, but the gas is injected at the ion source end, which is usually held at high voltage. In that configuration, the ion source and accelerator had to be carefully designed to have high gas flow to permit the gas to escape down the accelerator. Even with such design, the basic physics of the system limits the vacuum level achievable in the ion source region, limiting the maximum voltages that can be used and increasing arc frequency, which is detrimental to stability and long-term operation.

B. Pressure Vessel within a Pressure Vessel

Equipment that needs to be held at high voltage is usually enclosed in a smoothly shaped high-voltage dome inside an insulating-gas-filled pressure vessel, in order to minimize disruptive and potentially damaging arcing events. However, some auxiliary components cannot operate correctly in a pressurized environment. Therefore, provided herein is a solution where the components (e.g., roughing pump) that need be located inside the pressure vessel for reliable operation at high voltage, but cannot operate in a high-pressure environment, are placed in a smaller (inner) pressure vessel that is pressurized to nominal atmospheric pressure, and is connected via a tube to the exterior of the larger (outer) pressure vessel.

Figure 10:
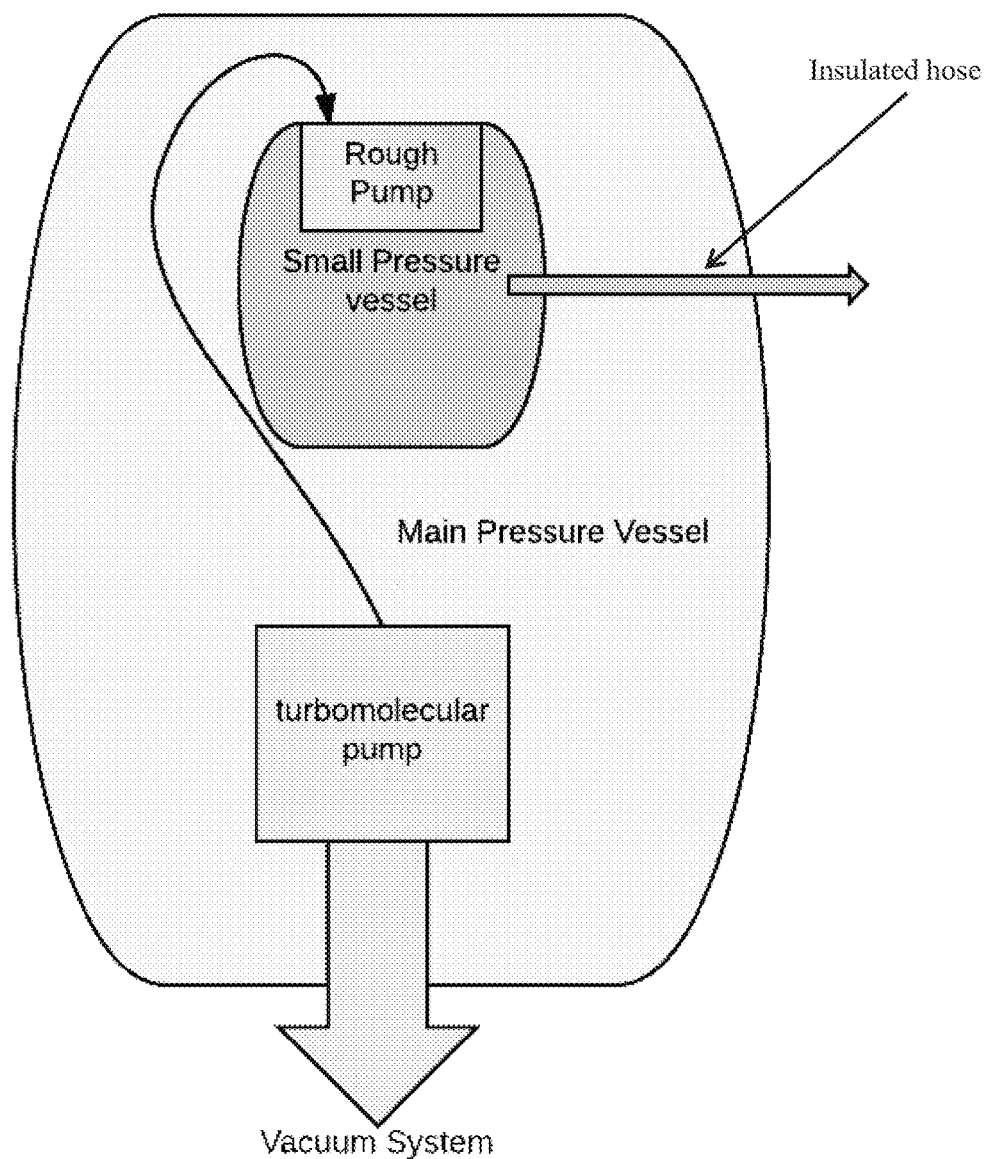
FIG. 10 provides an exemplary schematic of gas pumping flow in a nested pressure vessel configuration, where a roughing pump is located inside an inner (smaller) pressure vessel inside an outer (larger) pressure vessel, so that it can operate at a different pressure (e.g., atmospheric pressure).

For example, as described in the section above, a roughing pump is used to back the turbomolecular pump added to the ion source for removing gas from the extraction region. The roughing pump performs best at atmospheric pressure, not the pressurized environment created by the larger (outer) pressure pump (see, $SF_6$ pressure vessel in FIG. 1). As such, as shown in FIG. 10, a nested pressure vessel configuration is provided, where the roughing pump is located inside an inner (smaller) pressure vessel inside an outer (larger) pressure vessel, so that it can operate at a different pressure (e.g., atmospheric pressure). It is noted that, in work conducted during the development of embodiments of the present disclosure, attempts to operate the roughing pump in a pressurized environment lead to gas leaking into the pump, so that the pump had to work harder. Also, without the use of the roughing pump in the inner pressure vessel, this could lead to gas backstreaming through the turbomolecular pump and poisoning the vacuum system.

C. V-Belt

Power for components held at high voltage needs to be supplied in a manner that is electrically isolated from ground. Prior art for providing this energy has included isolation transformers and generators driven by insulated shafts or belts. Most belts in production for power transfer applications have either steel cables embedded in them, high amounts of carbon added to the polymer, or both. Both of these features prevent them from maintaining the voltage isolation requirement because they make the belt an effective electrical conductor. While other belts do not conduct electricity easily, they are usually either too weak to handle the large amount of transmitted power or have been observed to become more conductive over time, leading to breakdown and failure of the belt.

A solution this problem is provided herein by providing systems comprising: a) at least one high voltage component that is held at high voltage in an accelerator system that generates a high-energy ion beam, and b) an electrical power component that is electrically linked to the at least one high voltage component, wherein the electrical power component provides electrical power to the at least high voltage component (e.g., in a manner that is electrically isolated from ground), wherein the electrical power component comprises a V-belt, and wherein the V-belt comprises a plurality of segments (e.g., 3 . . . 25 . . . 100 . . . 400 segments) and is: i) a poor electrical conductor, or ii) an electrical non-conductor.

V-belts have been identified that can both handle the power loads that are transferred and maintain the necessary electrical isolation. For example, a segmented-type V-belt such as the Fenner POWERTWIST was found to successfully transmit large amounts of power across the voltage gap.

III. High Voltage Systems

In various embodiments, the high voltage system has a number of improvements that contribute to its improved behavior. These include: direct ion injection; actively-cooled water resistors; an ideal electrostatic lens design process; the use of precision insulating balls for electrical isolation and alignment of electron suppression elements. Each of these improvements will be discussed in turn.

A. Direct Ion Injection

Many beamlines require components located between the ion source and the accelerator. This Low Energy Beam Transport (LEBT) section accepts the beam as it exits the plasma source and delivers it to the accelerator with the required beam parameters. Typically, the LEBT includes but is not limited to analyzing magnets, focusing elements, electron suppression elements, and beam choppers. Such components are necessary if the beam extracted from the plasma source is not of high enough quality to be accepted by the accelerator. Such LEBT components add to the size, cost, and complexity of the system. Increased complexity generally leads to lower reliability and a less robust system. Additionally, due to increased space charge in the beam, these problems generally become more pronounced for high-current DC beamlines.

In light of these possible issues with LEBT components, in some embodiments, provided herein are direct-ion injection systems that do not employ any LEBT components. In order to provide for just direct ion-injection, various solutions are employed, including quickly modulating the microwave power, altering the drift length (distance between ion source and entrance to accelerate column), reducing the pressure in the accelerator column, and reducing the pressure in the high-voltage area (e.g., using the first and second vacuum pumps described above and herein).

The high atomic fraction characteristic of microwave ion sources can eliminate the need for species-analyzing magnets between the ion source and accelerator. Sufficient vacuum pumping in the beamline reduces background ionization and the need for electrostatic electron suppression between the ion source and accelerator. This is further facilitated by adding pumping at the high voltage end of the accelerator, as explained herein.

Many ion source technologies, such as those based on filaments, rely on thermal processes and are relatively slow to turn on and off. With such sources, the extraction or acceleration high voltage power supplies must be shunted or switched to quickly modulate the beam. This adds complexity and cost while generally reducing reliability.

Figure 11:
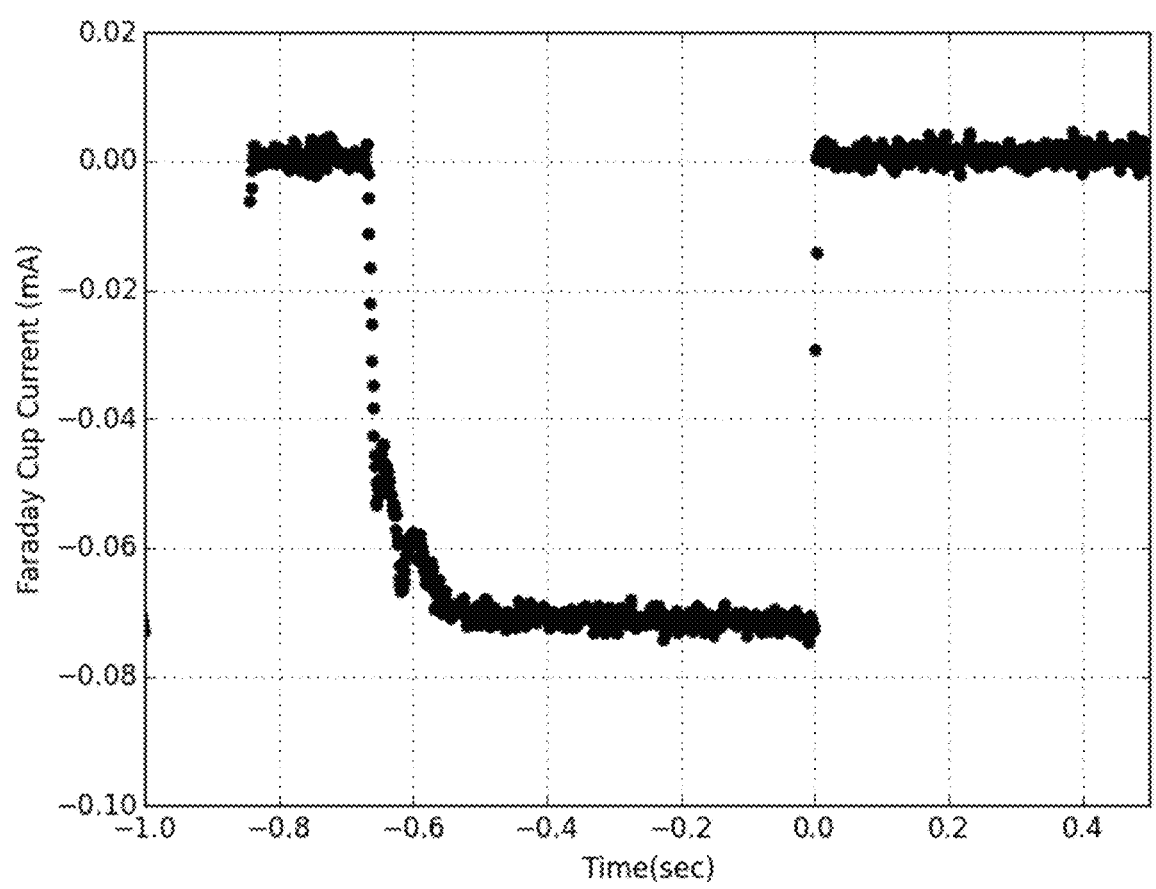
FIG. 11 shows an example of pulsed beam from modulating magnetron (measured with a Faraday cup), which modulates the microwaves entering the plasma chamber.

In certain embodiments, the microwave ion source is directly modulated quickly by controlling the driving microwave power. This allows the beam to be rapidly pulsed or extinguished while the extraction and acceleration high voltage power supplies remain steady. Such functionality allows for system commissioning and machine protection without the need for beam choppers, kickers, or high voltage switching circuits. FIG. 11 shows an example of pulsed beam from modulating magnetron (measured with Faraday Cup), which modulates the microwaves entering the plasma chamber.

In the direct injection architecture, the beam extracted from the ion source immediately enters the accelerator, as illustrated in 12A. This geometry minimizes drift length and thus reduces the increase in beam diameter due to space charge. The ion beam diameter is an important factor for solenoid focusing elements. The ability to control the beam diameter and divergence by altering the drift length between the ion source and the accelerator thus allows for better performance when designing the full beamline by matching the ion source, accelerator, focusing elements, and target. Therefore, in certain embodiments, the drift length is altered (lengthened or shortened) to optimize the direct injection architecture.

The "drift length" is the physical distance the beam travels in a region with no external electromagnetic fields. This corresponds to the physical distance between the extraction/suppression/exit lens group and the entrance of the accelerator column in the main system figure. This is the same location where LEBTs would be used in a non-direct injection system.

Figure 12A:
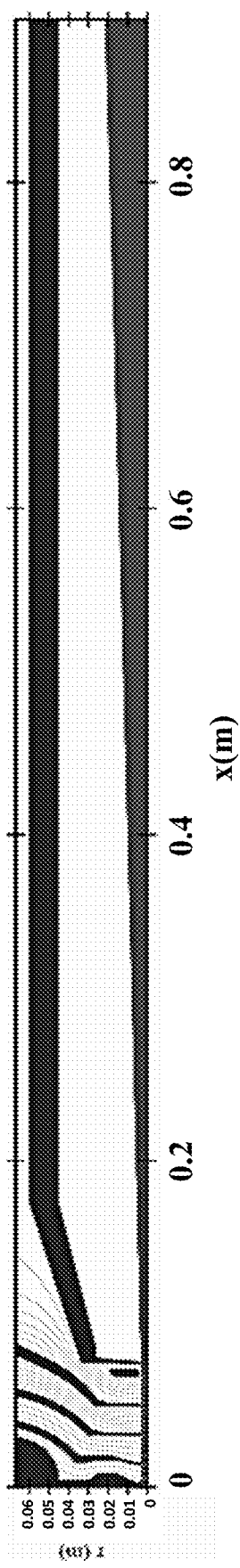
FIG. 12A shows an example of a simulation of beam trajectories in a direct injection, high gradient accelerator. 70 mA deuterium, 300 keV accelerator, 39 kV extraction. The Resulting beam generally has lower emittance but larger divergence.
Figure 12B:
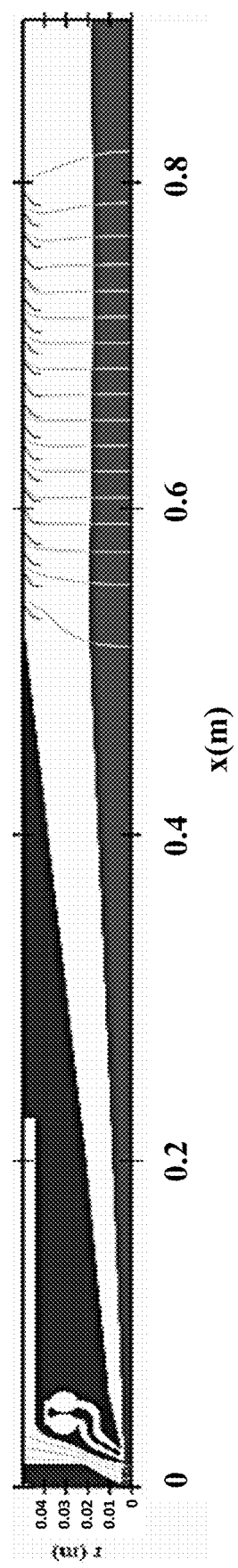
FIG. 12B shows an example of a simulation of the same beam with drift length and electrostatic suppression and drift region before a low-gradient accelerator. 70 mA deuterium, 300 keV accelerator, 39 kV extraction. The resulting beam has a larger emittance but lower divergence.

Examples of drift length before the accelerator is shown in FIG. 12B from 20-500 mm. In the field-free drift region, the beam becomes largely neutralized by background free electrons and space charge effects are significantly reduced. Under these conditions, the envelope of the beam extracted from the ion source can be approximated as a cone with a constant apex angle. As such, the diameter of the beam entering the accelerator, at the end of the drift region, can be determined by the length of the drift region in conjunction with this angle of expansion. The spherical aberrations and space charge effects in the accelerator are dependent on the diameter of the beam, making the length of the drift region between the ion source and the accelerator an important factor in the system's performance.

In is noted that, to operate reliably, direct injection systems generally require a more finely tuned ion source, which typically requires a lengthy commissioning process by skilled operators. As explained herein, automated system-tuning algorithms increase the speed and reliability of such processes. Any failures can also generally be handled automatically without operator intervention by the automated recovery systems explained herein. This can effectively minimize or eliminate any damage or down time caused by such transient events.

The elimination of electron-suppression components between the ion source and accelerator column generally allows any electrons created in the accelerator due to interactions with background neutrals or the accelerator walls to be carried back into the ion source at high energy. This can result in damage to the ion source components, reducing their lifetime, and puts an unnecessary load on the high voltage power supplies, increasing their cost.

In a well optimized system, there will be negligible levels of beam current impinging on any accelerator surfaces. Most of the detrimental backstreaming electrons are therefore created by interactions with background neutrals, so reducing the pressure (as discussed above) in the accelerator minimizes these issues. As explained in detail herein, increasing the vacuum pumping capability in the high-voltage region of systems with electrostatic suppression lenses (described further below) between the ion source and accelerator has been found to be an effective method to decrease the background pressure and thus reduce the backstreaming electron current, while improving system reliability and stability. Adding similar pumping to the high-voltage end of a direct injection system, in certain embodiments, should further improve overall stability and increase the lifetime of accelerator components. The detrimental effects of backstreaming electrons which do reach the ion source can be further mitigated with the so-called inverted waveguide discussed in detail herein.

Implementing direction injection, such as with using the technology discussed above, can reduce beam diameter and improve beam transport for high current ion beams. Tuning the beam characteristics can allow for smaller apertures on differential pumping systems, longer beam transport distances, or better acceptance into downstream high-energy accelerators. In general, smaller beam size and apertures is important for gas targets. Also, longer transport is important for targets which need to be located a large distance from the ion source including but not limited to accelerator driven subcritical assemblies. Also, acceptance into downstream accelerators important to high energy physics labs.

B. Actively Cooled Water Resistor

High-voltage power supplies (HVPS) are used run components of accelerator systems. When testing such a HVPS, it is necessary to connect the output to a test load to ensure the HVPS meets specifications. The test load needs to withstand voltages of up to 300 kV DC and reject up to 30 kW, or about 3 kW, or about 5 kW, of heat. Building such a test load requires purchasing multiple expensive, specialized resistors to operate at different loads.

Also, certain accelerator use a resistor divider, composed of a string of resistors to evenly divide the voltage along the accelerator to prevent arcing and give a uniform electric field to properly accelerate the ion beam. Conventional resistors must be rated for high voltage, are bulky, and have limited power dissipation, which limits the performance of the accelerator.

Figure 13:
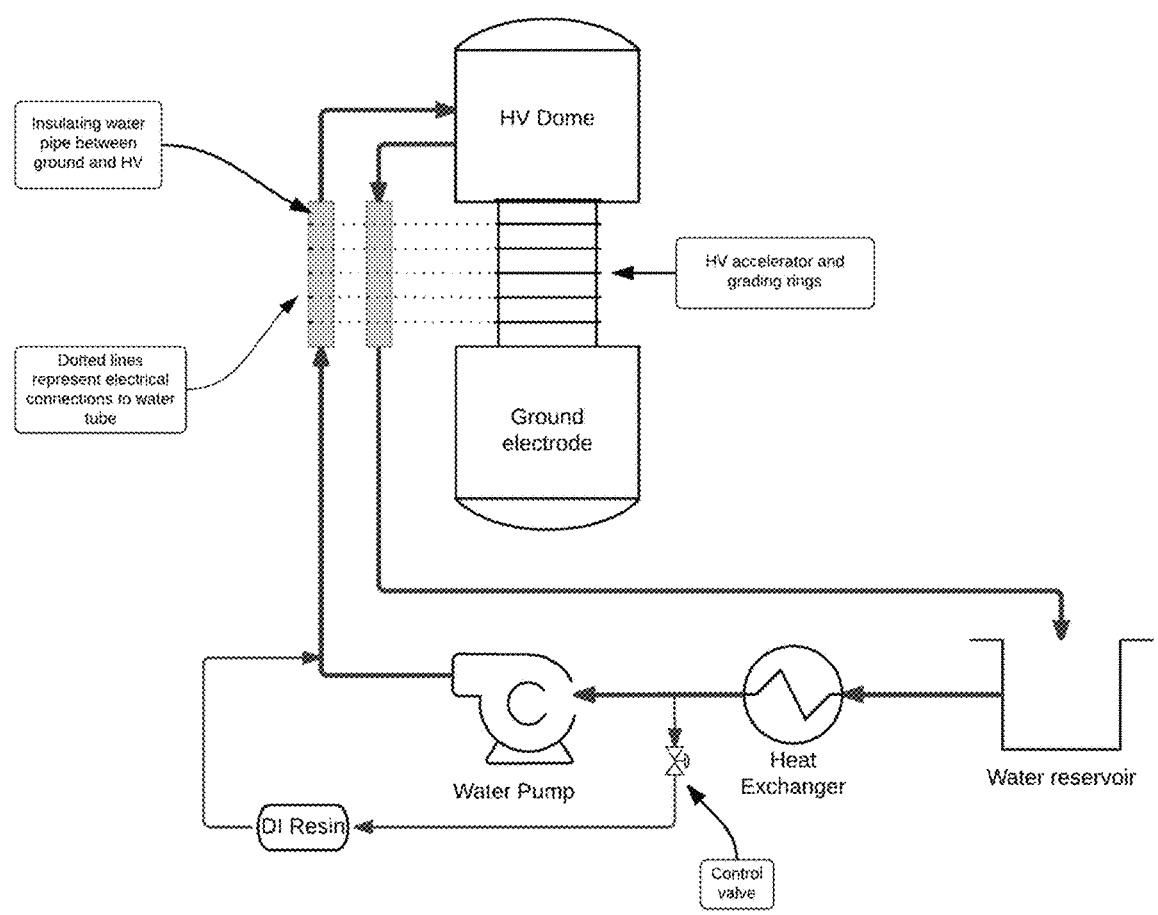
FIG. 13 shows an exemplary actively cooled water resistor system.

Provided herein are, in certain embodiments, recirculating, high-power, high-voltage water resistor, or test load, which has been used to test HVPS at voltages of up to 300 kV and at power levels of up to 30 kW. The same concept has also been used as a flexible high-voltage grading resistor for electrostatic accelerators (see, FIG. 13).

These systems and methods use recirculating controlled conductivity water as the resistive element. Insulating tubing (e.g., plastic tubing) is connected between the ground electrode and the high-voltage electrode(s). A water pump takes water from a reservoir and circulates it through the electrodes, through a heat exchanger to remove dissipated heat, and back to the reservoir.

Deionizing (DI) resins are used to reduce the conductivity of the water, and dilute metal salt solutions are used to increase the conductivity as needed. By actively controlling the conductivity of the water, the resistance can be changed over a wide range. The DI resin used is generally capable of producing deionized water to 15 Megohm-cm resistivity or higher. This resin is often provided commercially as "mixed-bed" resin, which is composed of equal parts hydrogen form strong acid cation resin and hydroxide form strong base anion resin.

The voltage rating of the water resistor can be changed by adjusting the length of the insulating tubes to increase or decrease the breakdown voltage, as desired. The power capacity of the resistor is adjusted by choosing the diameter of the tubing and the water flow rate so the water does not exceed the boiling point at the design power rating.

During development of embodiments of the present disclosure, it was found that soft vinyl tubing developed pinhole leaks due to high-voltage arcs. Suitable materials for the electrically non-conductive tubing include, but are not limited to, polycarbonate, polymethyl methacrylate (PMMA), and polyethylene. Metal salts that may be used include, but are not limited to, copper sulfate, sodium chloride, ammonium chloride, magnesium sulfate, sodium thiosulfate.

An exemplary embodiment of these systems is as follows. The water resistor is initially charged with deionized water. For this reason, the materials used in construction of the water resistor should be compatible with DI water systems. In general for best performance, all metal in the system should be the same, and it may be, for example, either copper, aluminum, or stainless steel. In general, mixing metal types enhances corrosion and shortens the lifetime of components. The metal salts used to decrease resistance should be compatible with the metal selected, e.g. copper sulfate is used with copper, ammonium chloride is used with stainless, etc. A mixed-bed DI resin of 15 or 18 MΩ-cm is used to remove excess ions from solution and increase the resistance. In certain embodiments, the following are employed: stainless electrodes, a stainless heat exchanger, magnesium sulfate salt, and 15 MΩ-cm color-changing DI resin.

In a working exemplary application for a high power, high voltage load, the system is as follows. The insulating tubing was two pieces of polycarbonate tubing, 0.95 cm ID, 90.0 cm length. The DI resin was ResinTech MBD-30 indicating resin. Copper tubes were used to make electrical connection to the dilute salt solution. The electrolyte was copper sulfate. The resistance of the test load is calculated as $R=\rho*L/A$, where rho is the resistivity, L is the tube length, and A is the tube area. With pure DI water of 18 Megohm-cm resistivity, the test load resistance was R=18e6 ohm-cm*2*90 cm/0.71 sq. cm.=4.6e9 ohms. This high resistance is essentially zero load and permitted full voltage, zero load tests to be conducted. Copper sulfate was then added to decrease the resistivity to 2960 ohm-cm, which gave a resistance of 750 kilohms. This permitted the test load to be operated at 150 kV, 200 mA. The 30 kW of dissipated power was rejected to cooling water through a heat exchanger.

In certain embodiments, PLC/software controls fully automate the system, allowing an operator to select a resistance and the system would automatically compensate for small drifts in temperature or conductivity. Additionally, a sealed system or other method to prevent atmospheric oxygen or $CO_2$ from contacting the water would increase chemical stability and prolong the lifetime of the system by requiring fewer consumables or increasing the time between service intervals.

C. Lens Design

An electrostatic lens stack is used to extract ions from the microwave plasma source and form them into a beam. An electrostatic lens stack is composed of: i) a plasma lens, ii) an extraction lens, iii) a suppression lens, and iv) an exit lens. The precise shape of the lenses affects the beam properties at given source parameters and applied voltages, in terms of current density, spot size, divergence and emittance. These affect the robustness of the system, the total extracted current and the high-voltage requirements. A process is required to determine the appropriate lens shapes to obtain beams of the desired properties as it propagates through downstream components (e.g., an accelerator column, a focusing solenoid or low-conductance apertures) subject to operational constraints, such as maximum applied voltages and electric fields.

Figure 14:
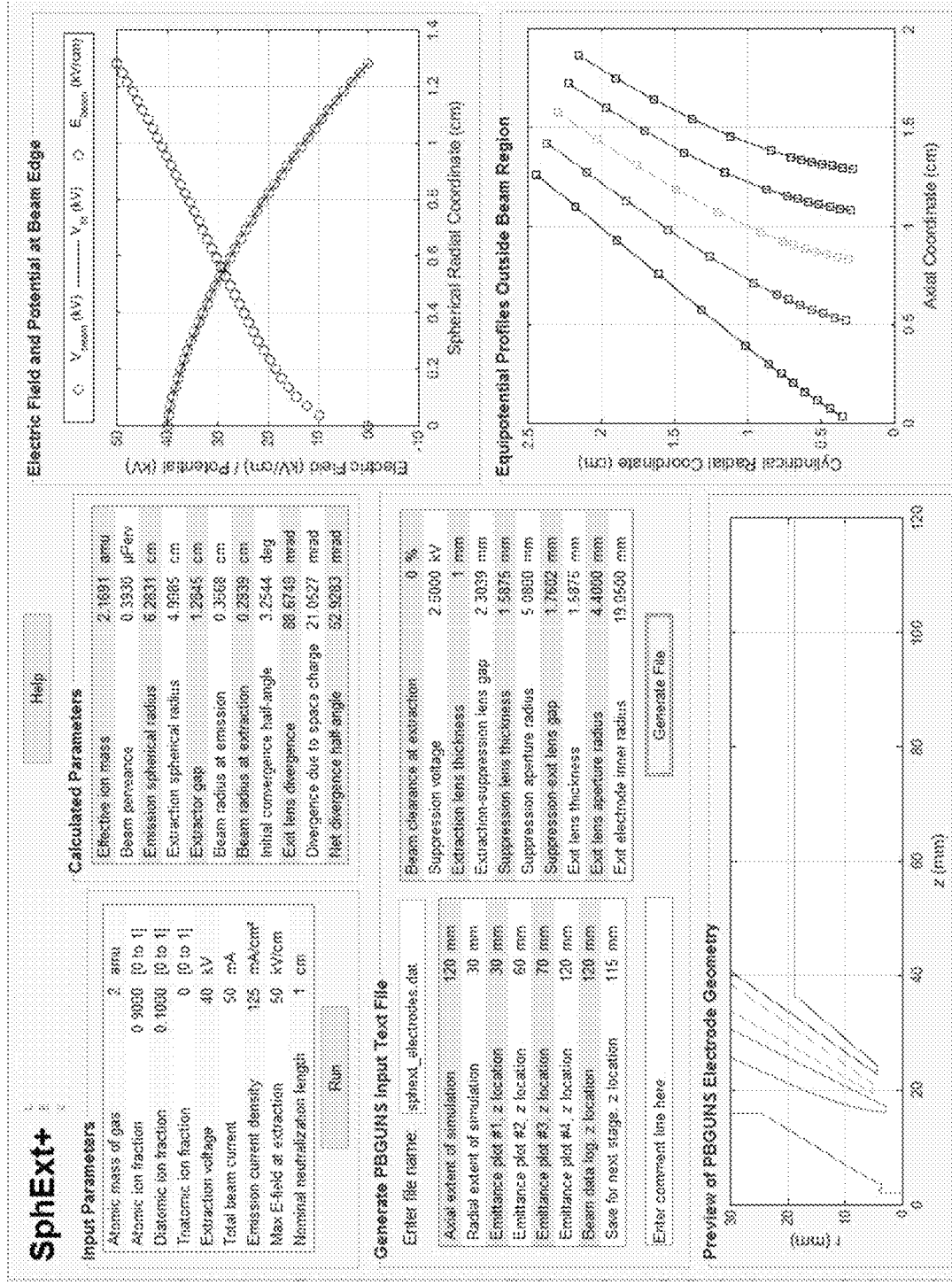
FIG. 14 shows an exemplary user interface for the lens design software application.

In certain embodiments, provided herein, the lens design process starts with an internal computer code that determines nominally ideal profiles for the plasma and extraction lenses, given the desired beam properties. It also generates a file to input the calculated lens geometry into PBGUNS (Particle Beam GUN Simulations), a commercially available program used to simulate the ion beam transport through the extraction system and downstream components. FIG. 14 shows an exemplary user interface for the lens design software application.

Figure 15:
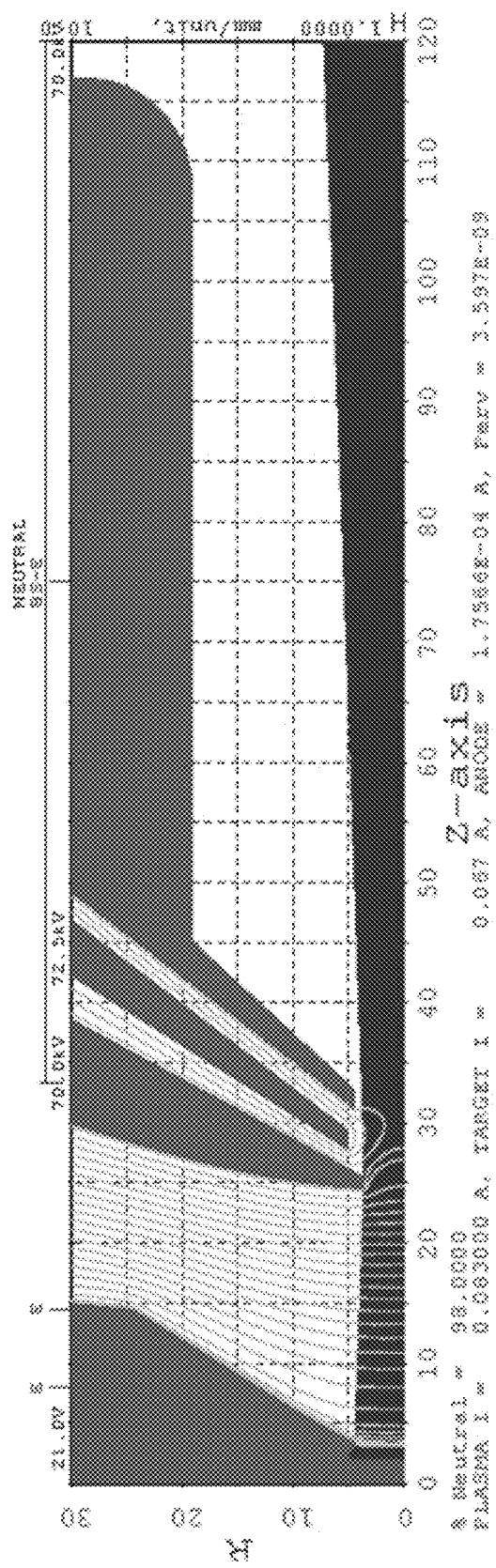
FIG. 15 shows a sample beam trajectory plot from PBGUNS.

PBGUNS outputs beam trajectories and results, can be used to confirm the suitability of the lens stack designed, or suggest changes that can be made to the geometry to optimize the beam quality and thus the overall system's performance. FIG. 15 shows a sample beam trajectory plot from PBGUNS.

The inputs to the lens shape determination code are: beam current, extraction voltage, ion species fractions, maximum electric field, and ion current density at the plasma lens aperture. The code outputs lenses that result in spherically convergent, space-charge-limited ion flow between the plasma and extraction lenses, while satisfying the equations for zero charge (Laplace equation) outside the beam and yielding a matching solution between the two regions, at the edge of the beam.

PBGUNS has many inputs beyond the geometry of the system. These include the grid precision, an empirically determined beam neutralization factor, and the electron and ion temperatures in the source plasma. The program outputs a beam trajectory plot, as well as phase space plots and emittance calculations at specific axial locations. Some limited beamlet data is also output for a single axial location per run, which can be used for post-processing the results in greater detail.

In certain embodiments, other programs are used to design lenses that allow for simulating 3D configurations (e.g., if one considers multiple-aperture extraction systems to increase the total current that can be extracted from a plasma source, which may be important for some applications). Other software packages such as IBSIU allow for 3D configurations, while also running 2D geometries faster than PBGUNS, though the full calculation may not be as accurate.

D. Implementation of Suppression Elements

High energy ion beam generators may employ an extraction lens stack, with a suppression electrode biased negatively with respect to the extraction lens and located immediately downstream from it, followed by an exit electrode in electrical contact with the extraction lens. The resulting dip in the electrostatic potential prevents electrons created downstream (e.g., by ionization or secondary emission off solid surfaces) from being accelerated to high energies and damaging source components. The confined electrons can also contribute more effectively to the space-charge compensation of the ion beam, reducing the beam size, divergence and emittance. Such a lens stack thus enhances the reliability of the system, improves the beam quality and increases the total current that can be transported to the target, resulting in greater uptime and throughput.

Provided herein are components used to align and hold together the electrodes in the lens stack, while withstanding the high voltages between them. This mechanism is mechanically robust, provides electrical insulation, is compatible with ultra-high vacuum, and is rated for operation at high temperatures, a complex set of criteria to balance.

Figure 16:
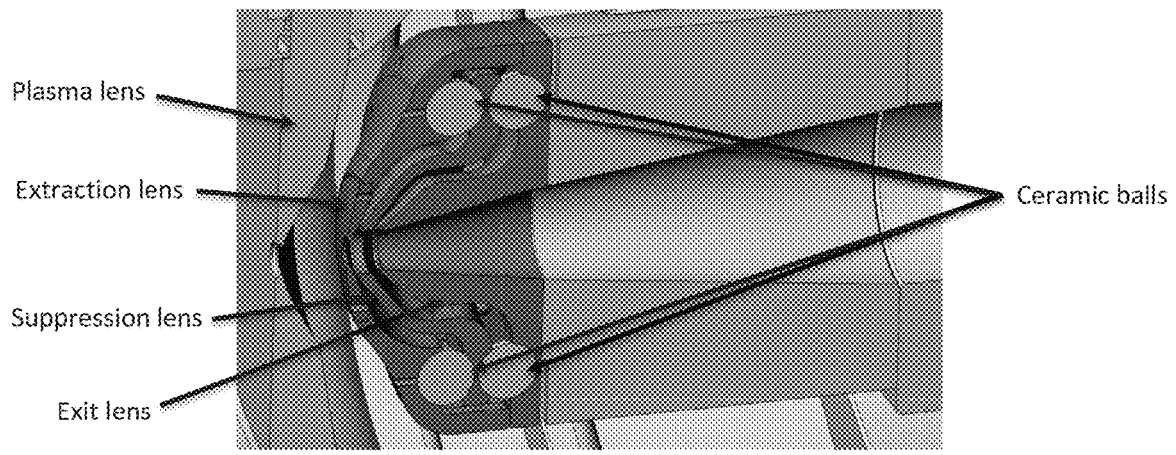
FIG. 16 shows an exemplary use of precision ceramic balls for electrical isolation and alignment of an electron suppression element.

In some embodiments, insulating balls (e.g., ceramic balls) are pressed between conical indentations on each pair of electrodes stacked together, for example, as shown in FIG. 16. In some embodiments, for each lens gap, three insulating balls (e.g., ceramic balls) are spaced evenly in the azimuthal coordinate to achieve mechanical contact on a fully defined plane. Given their high degree of spherical symmetry and diameter tolerances, ceramic balls allow for self-alignment of the lenses, since two electrodes pressed firmly against opposite sides of three ceramic balls have no remaining degrees of freedom, compared to other geometries.

Ceramic balls are rated for ultra-high vacuum, very high temperatures, are very hard and rigid, and have a high dielectric strength, providing insulation for use at high voltages. In some embodiments, the whole lens stack is held together by metallic bolts between the extraction and exit electrodes since these are held at the same electrostatic potential and electrical contact between them is desired. Metallic bolts are also much more durable than ceramic bolts.

Ceramic balls are readily manufactured or are available as off-the-shelf components, with very high precision in diameter (~0.1%) and sphericity (~0.01%) and at a relatively low cost. Ceramic balls are often made out of mostly alumina and are rated for temperatures over 1000° C., although other materials may be employed.

Before using precision ceramic balls, ceramic bolts, nuts and washers were used. These can be rated for vacuum, high temperatures and high-voltage operation. However, they are brittle and can break easily, as they are susceptible to shear stresses, especially when the axis of the lens stack is oriented horizontally. Also, since the through-holes in the electrodes are necessarily larger than the major diameter of the bolt threads, the lenses have a minimum of two degrees of freedom, so that self-alignment was not a feature of that type of assembly.

The use of precision ceramic balls has allowed for mechanically robust assembly of the extraction lens stack using a suppression electrode, plus inherent self-alignment between the lenses, while allowing for use at high voltages, high temperatures and ultra-high vacuum. This component helps improve the reliability of the overall system, in terms of mechanical stability, beam quality, and protection of source and beamline components, while increasing the total current that can be reliably transported to the target of interest.

IV. Neutron-Producing Target

A number of advances have been made to the neutron-producing target system that contributes to is exemplary performance. These include: A) the active cooling mechanism for a solid target; B) an argon sputter cleaning process; C) a mechanism for distributing the thermal load on tube apertures in a gaseous-target system; D) a reverse gas jet; and E) the implementation of a beam scraper.

A. High-Power-Density Solid-Target Cooling

For accelerator-driven neutron generator systems, the majority of the ion beam energy results in target heating rather than nuclear reactions. High-yield systems necessarily require high-power ion beams and removal of the resulting large heat loads produced in the target.

Solid targets are composed of a reactive species, typically deuterium or tritium, embedded in a solid matrix of non-reactive material. Such a non-reactive matrix generally will further reduce the efficiency of the generator as any interactions with the ion beam will only result in waste heat and not any desired nuclear reactions. Additionally, the high density of a solid target generally leads to a short stopping distance for the incident ion beam resulting in a high volumetric power density deposited into the target.

The volume in which the desired neutrons are produced through fusion reactions is defined by the volume within the target into which the beam ions are deposited. For certain applications, including but not limited to fast neutron radiography, a point-like neutron source is desirable to provide higher quality images. This corresponds to a small ion beam spot size on the target.

For a given total neutron yield, measured by the number of neutrons produced in a period of time, the neutron flux, measured by the number of neutrons per time per area, is generally increased as the neutron-producing volume within the target is reduced. A high neutron flux is desirable for applications including but not limited to neutron activation analysis and materials testing for reactor components.

For reasons including but not limited to those described above, depositing the ion beam's energy into a small volume is desirable for the performance of accelerator driven neutron generators. Beam-focusing elements can be used to reduce the spot size on the target to nearly arbitrarily small areas limited by space charge effects. In practice, the achievable spot size is limited by the high power deposition of the ion beam into the solid target.

For the application of accelerator-driven neutron production via fusion reactions between nuclei of hydrogen isotopes, a solid target material with a high hydrogen storage capacity such as titanium is desirable for high neutron yields. Deuterium or tritium is embedded into the target directly by the beam in situ or in an oven baking process.

Beyond the physical destruction of a solid target through mechanisms including melting and ablation, solid-target neutron generators utilizing deuterium or tritium nuclear reactions must be maintained below the temperature at which diffusion leads to loss of hydrogen from within the target material. Generally, the hydrogen vapor pressure of metal hydrides becomes prohibitive at temperatures above about 250 degrees Celsius.

In general, there are two fundamental cooling requirements for the ion beam target. First, the total average power deposited by the beam should be rejected to prevent the bulk heating of the target assembly over time scales on the order of the thermal time constant. Second, the instantaneous power density of the beam incident on the target material should be low enough to prevent immediate localized material damage.

The average ion beam power is determined by the product of the beam current, beam energy, and duty cycle. This value is typically on the order of thousands to tens of thousands of watts in some of the exemplary systems described herein, though the same principles apply to higher power levels. The resultant steady state bulk temperature rise is determined by the mass flow rate and specific heat of the coolant. This first requirement is readily satisfied with modest mass flow rates (e.g., 10-100 gallons/minute of coolant) of coolants including but not limited to water, glycol, or oil.

The second requirement, relating to volumetric power density, is generally more difficult to achieve for high performance systems. The incident beam power is deposited into a thin surface volume defined by the beam spot size and the stopping power of the beam in the target. This power must transfer through the target material and into the coolant before being removed. Heat transfer at an interface is defined in part by the materials, geometry, surface condition, and coolant fluid dynamics.

The target temperature should be kept below about 250 degrees Celsius to prevent loss of embedded hydrogen and hydrides required for nuclear fusion reactions. This is accomplished with minimized target wall thickness, high thermal conductivity materials, increased coolant surface area, turbulent coolant flow, and clean coolant channel surfaces.

The performance of early systems using open-loop water cooling was found to degrade over time. Given the very low thermal conductivity of mineral deposits that build up in the cooling channels, even an extremely thin layer has a significant effect on heat transfer and on the resulting target surface temperature. The elevated temperatures inherent in the target tend to increase the precipitation of mineral deposits, which restrict coolant flow, reduce cooling capacity, and can create runaway failure modes.

Closed-loop cooling with actively filtered and deionized coolant prevents such deposits in the target while extending the lifetime and improving the performance of the target.

One approach to reduce the power density on the solid target is to position it on an oblique angle such that the ion beam is deposited over an ellipse with a high eccentricity and increased surface area. Many targets utilizing single angled planes, arrays of angled planes, or cones were tested. Such geometries are used on high-power beam stops where neutron production is not the primary application. Targets using this method are necessarily larger, more expensive and complex, and generally require more ancillary hardware. This makes such an approach undesirable for systems requiring a point-like neutron source or a compact and easily portable system.

To reduce the target size, the beam spot size on the target must be reduced resulting in higher power densities. To maintain the target surface temperature requirements under these conditions, more efficient heat transfer is needed. In some embodiments, the target walls are of minimal thickness (e.g., 0.005 to 0.020 inch; e.g., 0.010 inch). This dimension is limited by the structural integrity necessary to contain the coolant channel pressure. The difference in temperature between the target surface intercepting the beam's power and the coolant is proportional to the thickness of the target wall and the wall material's thermal conductivity. As such, both the material and physical structure of the target and cooling channel walls determine the performance of the solid target. Reducing the target wall thickness therefore allows for lower target surface temperatures. The ideal wall material has a high thermal conductivity, high tensile strength, and high machinability. Such materials include but are not limited to copper, silver, gold, diamond, diamond like carbon, or a combination thereof.

Figure 17:
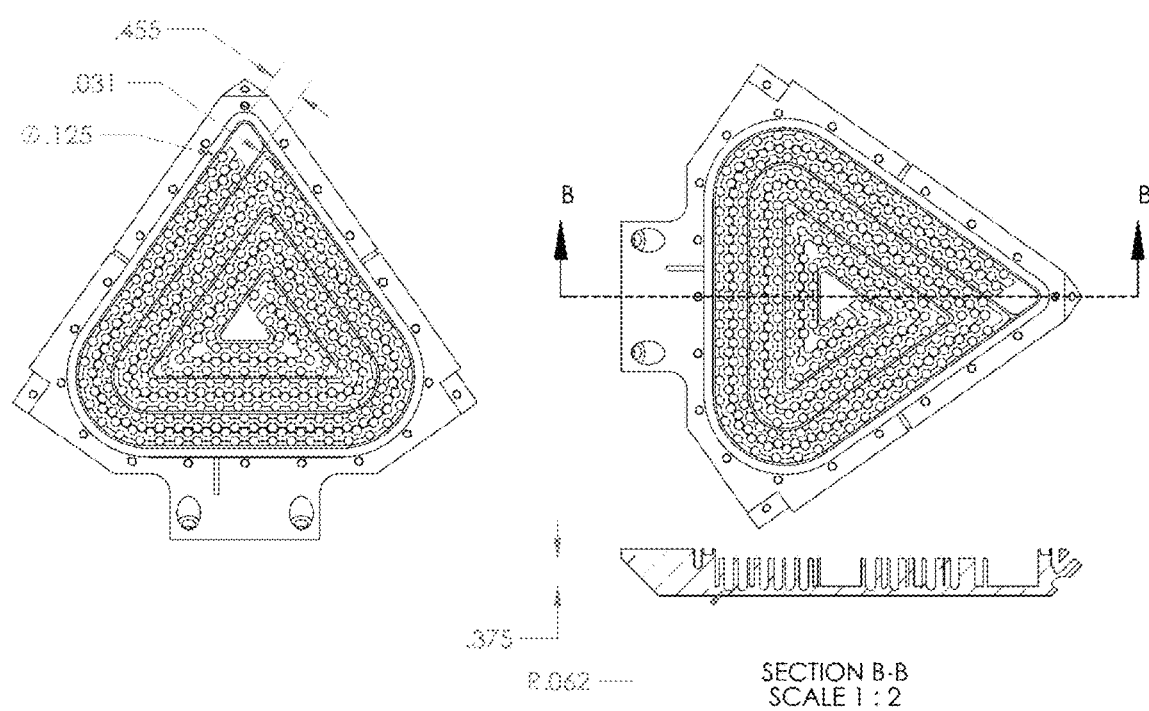
FIG. 17 shows one embodiment of a liquid cooled solid target featuring turbulence inducing structures comprising a plurality of parallel fins with dimpled holes to interrupt smooth surfaces. The left panel shows a top view. The right panel shows a cross-sectional view with the plane of cross-section identified.

Additionally, the effective surface area is increased through the addition of fins, ribs, or other convolutions. Such features can increase the structural strength of the target allowing for thinner walls. Features can be manufactured with multiple techniques including but not limited to milling, casting, or additive manufacture. Example of turbulence inducing structures include a plurality of parallel fins with dimpled holes to interrupt smooth surfaces. An exemplary structure is shown in FIG. 17.

In the some embodiments, water is used as the coolant. This allows use of a wide range of low cost and reliable commercial pumps, filters, and other ancillary equipment to support the cooling system.

Other embodiments may make use of other coolants including but not limited to oils, gasses, or liquid metals. Additives may also be used to alter the properties of the coolant.

A high quality closed loop coolant system maintains clean coolant channel surfaces. This sealed system prevents atmospheric oxygen or other substances from being available to react with the surfaces of the coolant channels. The coolant loop is also further processed with techniques including but not limited to deionization and filtering.

Figure 18:
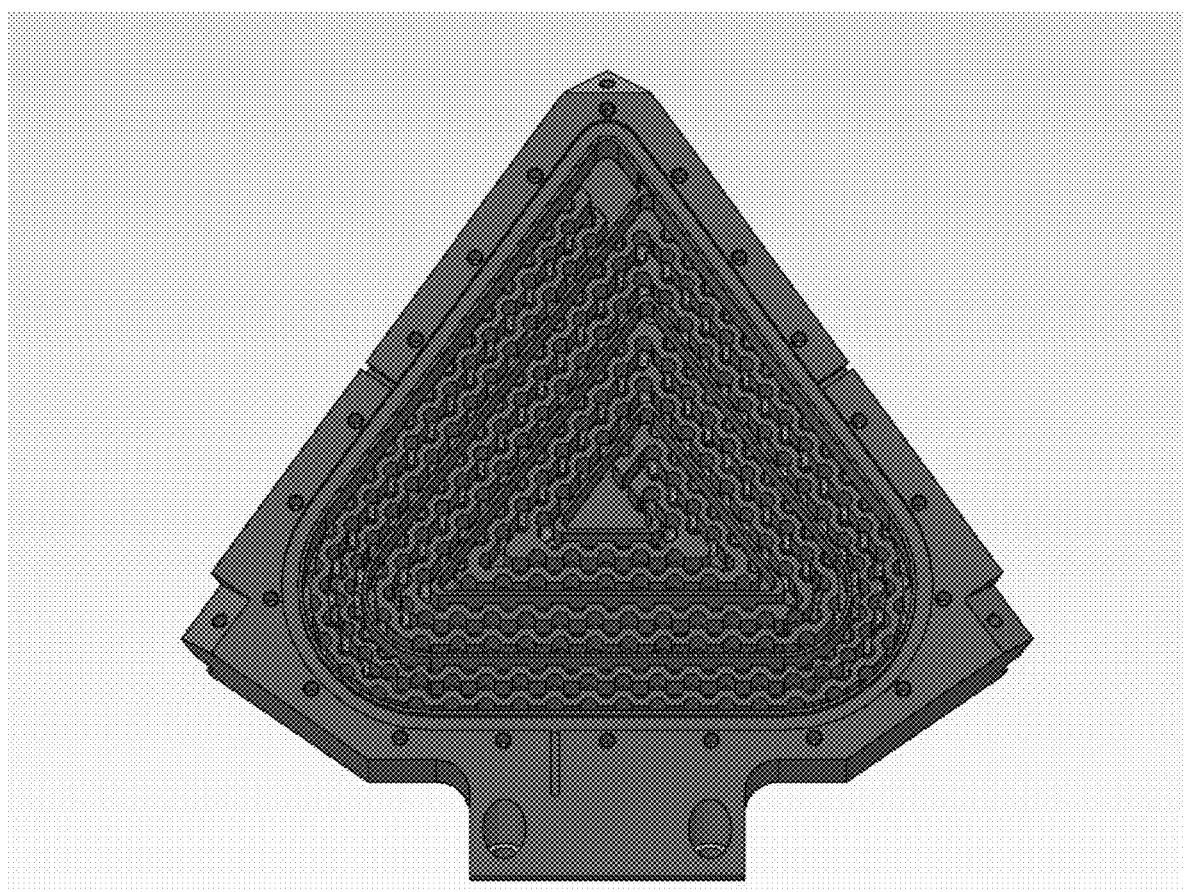
FIG. 18 shows an example of turbulence-inducing irregular features in fluid cooling channels of a solid target.

Laminar flow produces an insulating layer at the fluid-solid interface of the cooling channels and restricts heat transfer. Irregular features such as intermittent dimples and spiraled indentations, as illustrated in FIG. 18, tend to induce turbulent flow instead, improving the heat transfer of the system. The fluid coolant channels are located within the fact of the solid target assembly. This assembly is located at the end of the beamline. In the some embodiments, the solid target is located at ground potential and does not require any specialized connections to the overall system. In some embodiments, the solid target is thermally isolated from the rest of the system. This allows calorimetric measurements of the power deposited by the ion beam into the target by monitoring the temperature and flow rate of the coolant through the target. As the energy of the ion beam is known, the power deposited can be used to determine the electrical current carried by the ion beam to the target.

Other embodiments of the solid target assembly are electrically isolated from the overall system allowing it to be biased to a high voltage in order to increase the effective ion beam energy and neutron yield. Such embodiments entail the coolant be transported to the high voltage solid target from pumps located at ground potential or use of a fully closed loop cooling system isolated at high voltage. Such methods are similar to those described herein for providing cooling or electrical power to the ion source which is also electrically biased to a high voltage with respect to earth ground.

Turbulent flow also generally has larger pressure losses. The coolant flow rate and pressure drop should be considered in the design of the turbulence-inducing features. Computational fluid dynamics simulations are used to determine these values and match them to the performance of the coolant pumping system. By adjusting the number of elements in parallel or in series, the operational flow rate and pressure drop of the target is adjusted.

The heat transfer performance of the target is characterized by a temperature differential between the coolant and the target surface. The absolute temperature of the surface is therefore reduced for a given system by reducing the inlet coolant temperature. Pre-cooling of the closed loop coolant is achieved with a chiller or other methods. The lowest achievable coolant temperature is generally limited by the melting point of the coolant.

The pre-cooling of water-based coolants is limited by its relatively high melting point. The use of other coolants, such as helium, allows for much lower temperatures of the coolant as it enters the target. This results in a lower target surface temperature for a given ion beam power density. Similarly, higher ion beam power densities, resulting in more point-like neutron sources and higher fluxes, can be achieved while maintaining the necessary low target surface temperature.

The low mass of hydrogen species results in a low sputtering rate for metal targets. The lifetime of the target surface is reduced if the beam contains heavier ion contaminants, which can be removed with an analyzing magnet or other mass-filtering component in the beamline prior to the target.

High-power-density ion beam targets allow for more physically compact and portable systems, more point-like neutron sources, and higher neutron fluxes.

B. Cleaning of Solid Target to Maintain Neutron Yield

Neutron sources sometimes use a beam target plated with titanium metal. The titanium adsorbs significant amounts of deuterium so that incoming deuterium can cause fusion reactions, releasing neutrons. However, titanium is a fairly active metal that can also react with oxygen and nitrogen, forming a barrier to the deuterium beam and lowering neutron output. Trace contaminants in a vacuum system can be high enough to cause this problem to occur.

Figure 19:
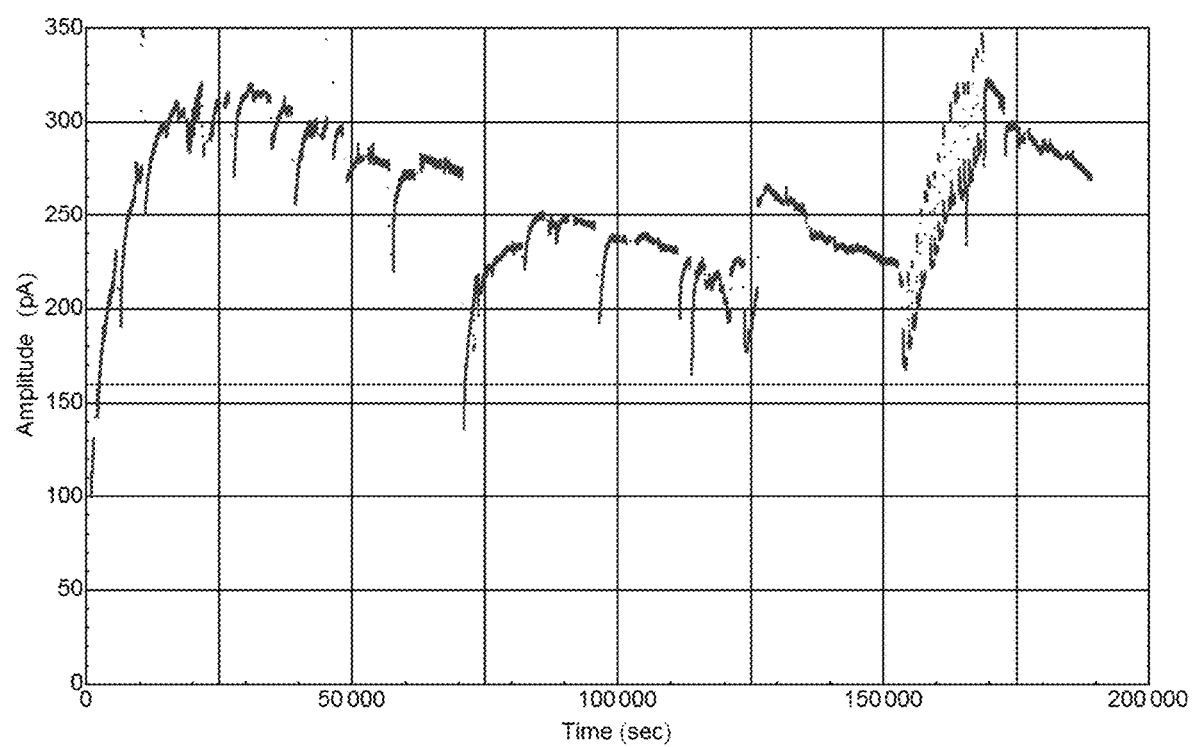
FIG. 19 shows a graph of neutron yield from a titanium-plated target as a function of time.

In some embodiments, a small amount of argon gas (e.g., 1 to 10 standard cubic centimeters per minute) is flowed into the vacuum system while the beam is operational. The ion beam transfers some kinetic energy to the argon gas. The energetic argon atoms then impact the target surface and remove the contaminating oxide/nitride layer by sputtering. Argon is much heavier than the primary beam species, so it is efficient for inducing sputtering, while its chemical inertness prevents it from forming other compounds with titanium on the target surface. FIG. 19 shows the effects of titanium compound formation and the argon cleaning process on the neutron yield. The target initially loads with deuterium up to 10,000 seconds, but then a slow accumulation of titanium oxide/nitride lowers the neutron output. A brief argon cleaning occurs at 125,000 seconds and an extended cleaning between 150,000 to 175,000 seconds, bringing the neutron output back up to initial levels.

The argon should be fed into the vacuum system as close as possible to the solid target in order to make the local argon pressure near the target as high as possible without excessively increasing the overall vacuum system pressure. In some embodiments, a source of argon gas is connected to the vacuum system by a metal tube that resides inside the vacuum and delivers the argon directly at the solid target location.

Other heavy, inert gasses may also be employed, such as krypton and xenon, although they are more cost prohibitive.

The only previous method was to remove the target from the system and mechanically clean the target to remove the titanium oxide/nitride layer. This was a time-consuming process and removed significantly more of the target plating than necessary, severely reducing target lifetime. Furthermore, periodic replacement of targets reduces the uptime of the system, and thus the total throughput for the user over time.

C. Tube Apertures

In gaseous-target neutron generators, a large pressure gradient needs to be maintained between the target and the accelerator in order to maximize the total neutron yield. Therefore, the aperture separating the target gas from the ion beam accelerator is necessarily small (e.g., a few millimeters in diameter). The ion beam power density is correspondingly large when passing through the aperture (hundreds of $MW/m^2$) and is not tolerable by any solid surface in steady-state operation. Small deviations in beam focus and steering due to thermal/mechanical or electrical variations in the accelerator system can result in severe damage to the target entrance aperture. This can lead to degraded system performance if the pressure gradient cannot be maintained or even severe system damage due to loss of vacuum and/or cooling water entering the vacuum system.

The ion beam is a few centimeters in diameter as it exits the accelerating stage and must be focused down to a few millimeters in order to pass through the entrance aperture to the gaseous target. The axial distance at which the beam is focused to its smallest diameter is dependent on the current in the focusing solenoid. A variety of an adjustable focusing mechanism may also be used, including electrostatic or magnetic quadrupole multiplets or permanent magnet/electromagnet hybrids.

In some embodiments, the ion beam is deflected laterally in two orthogonal directions by varying the currents in a crossed pair of dipole electromagnets ("steering" magnets) such that the central axis of the beam is centered on the gas target aperture, compensating for the accumulation of angular deviations due to mechanical tolerances in the alignment of beamline components over the long beam transport distance between the plasma source and the gaseous target.

Provided herein are systems to sense the distribution of ion beam power on the target aperture and use the information to actively control the focus and steering of the ion beam through the aperture. In some embodiments, this is accomplished with a four-quadrant thermal instrumentation embedded near the upstream-facing surface of the gaseous-target aperture, equally spaced at 90 degree intervals about the axis of the aperture. An exemplary implementation uses copper-constantan thermocouples in a copper target aperture, which may also serve as the copper leg of each thermocouple or the copper wires may be brought out separately. Other embodiments use platinum resistance temperature detectors (RTDs), thermistors, or semiconductor temperature sensors.

The four quadrant temperature signals are summed to provide an average target aperture temperature, which is used to maintain ion beam focus. Adjusting the current in the focusing solenoid to minimize the temperature of the target aperture maintains best focus against small perturbations due to beam voltage or current variation, or due to deflection or distortion of the overall beamline due to thermal expansion or mechanical stress.

Figure 20:
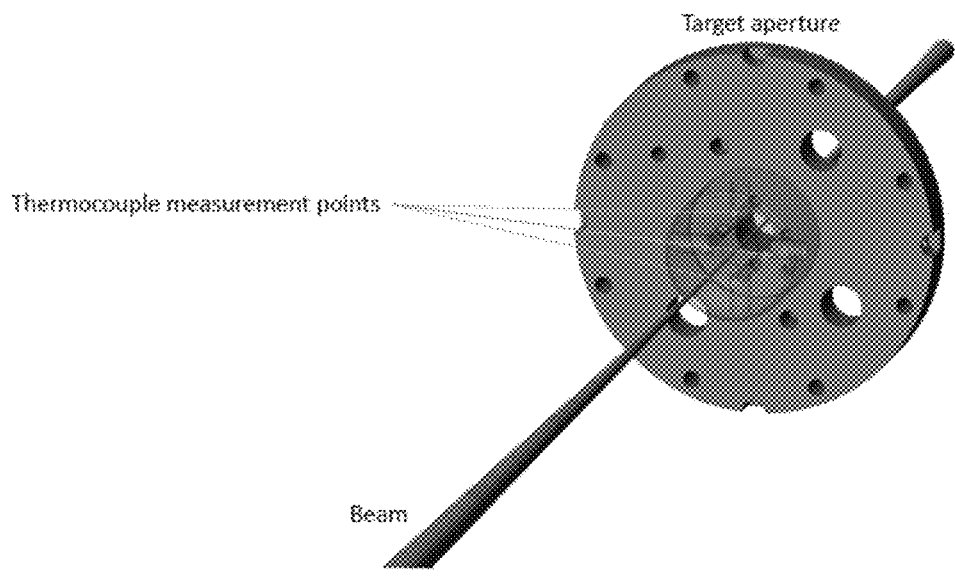
FIG. 20 shows an exemplary configuration of a system for focusing and/or steering of the ion beam through the target aperture.
Figure 20:
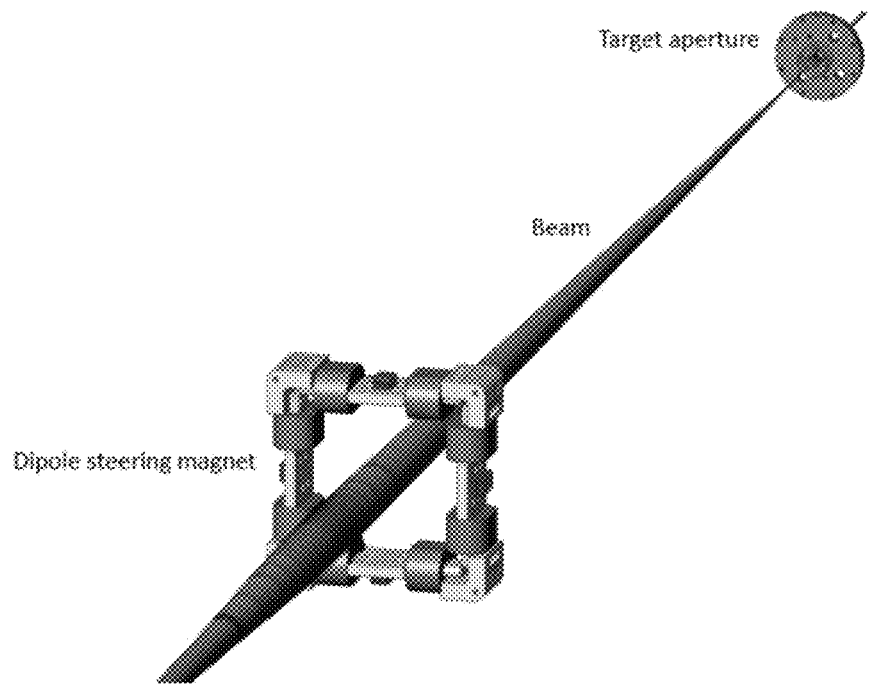

In this implementation, the sensors are arrayed about the axis of the beam passing through the target aperture at the positions toward which the steering dipole magnets laterally deflect the beam. The temperature difference between a first pair of diametrically opposed temperature sensors is used to maintain centering of the beam between the two sensors in the pair, which is also the center of the gas target aperture. Thus the current in a first magnet may be varied to minimize the temperature difference between a first pair of sensors corresponding to the direction that magnet deflects the ion beam. The difference between a second pair of diametrically opposed sensors and the corresponding variation of current in a second steering dipole magnet may be used to center the beam in the direction orthogonal to the first pair of sensors. FIG. 20 shows an exemplary embodiment of this system. The top panel shows the position of the thermocouple measurement points on the target aperture. The lower panel shows this component in the context of the beam and the dipole steering magnet.

D. Reverse Gas Jet

In a gaseous-target neutron generator, the pressure in the target should be as high as possible, such that the beam fully stops in as small a distance as possible, and the pressure just before the target should be as low as possible, such that energy is not wasted creating neutrons in an area where they cannot be effectively used.

Figure 21:
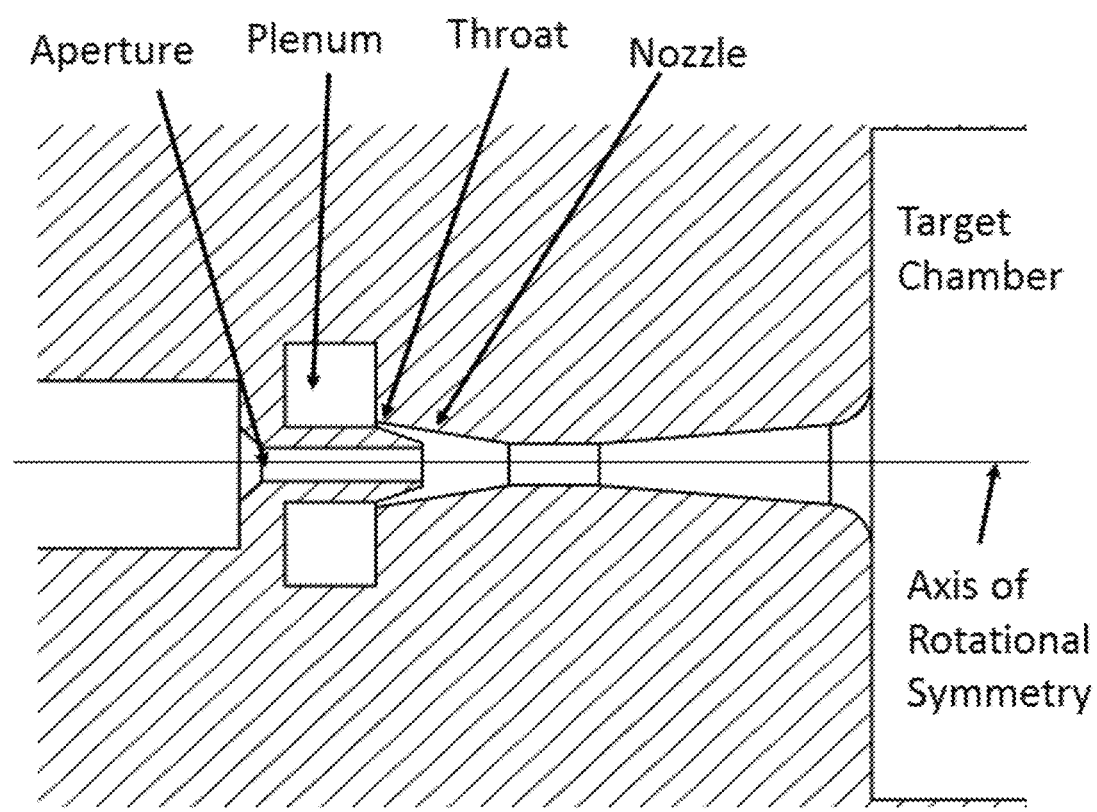
FIG. 21 shows a schematic of a reverse gas flow jet.

Provided herein are components to increase the pressure differential across the final aperture. In particular, provided herein is a reverse gas jet to effectuate the increase in pressure differential across the final aperture. An exemplary configuration of the reverse gas jet is shown in FIG. 21.

Modeling was done with a computational fluid dynamics (CFD) program to generate the geometry of a nozzle that would increase the pressure differential across the target aperture. Initial attempts used a nozzle that did not diverge after it converged, which did not work at all at the pressures of interest. Aspects such as throat gap, nozzle angle, nozzle length, and pressure in the plenum were varied. The plenum pressure was always kept below atmospheric pressure, to ensure that gas leaks and gas inventory would be kept to a minimum. After significant effort, a configuration as shown in FIG. 21 was developed and provides the desired pressure differential.

The aperture that the gas jet nozzle sits around was chosen to be $3/8$" (although other dimensions may also be employed), based on other requirements such as the size of the beam as it passes through the aperture. At this hole diameter, and with the types of pumps that were desired to use to drive the gas jet, a throat gap of less than 0.01" was important to keep the pressure drop high enough to cause supersonic flow. An average nozzle angle of 12.5 degrees was found to be optimal with parametric studies.

E. Beam Scraper

In some systems, a mechanism of inserting a solid target in the path of the beam that can block an arbitrary fraction of the beam is sometimes desired for precisely controlling the total current delivered to the target. Such a beam scraper can also be used to determine the beam profile, which is useful information during the optimization of the overall system.

In some embodiments, a solid target is affixed to a rail feature, and moved along that rail by a linear actuator made up of a long screw driven by a motor. Software measures the position of the target along the rails with "home" and "limit" switches in real time, and adjusts the position based on feedback from the system.

An initial approach used a rotary motion feedthrough that had the screw inside the vacuum. However, this required preventing galling in a vacuum, where lubricant selection is difficult, as well as coupling the multiple shafts together in tight quarters. Furthermore, the vacuum chamber was much larger and more expensive.

An alternative approach was attempted with success. The motor for the linear actuator creates heat, so it mounted outside the vacuum vessel, so that it uses air for cooling. This required the use of a linear vacuum feedthrough. Because most linear motion vacuum feedthroughs are bellows-sealed, they require a force to balance the vacuum force applied to the bellows, and as such put more strain on the motor to overcome those forces. Bellows-sealed feedthroughs also have a limited number of compression cycles they can withstand before they fail. For these reasons, a magnetically coupled feedthrough is more desirable, since it has neither of these problems.

Also, due to the negative consequences of water leaks in the vacuum system, in some embodiments all-metal hoses and fittings are used, and brazing is used to manufacture the entire target. This ensures that no leaks are possible without the metal itself failing. The target should also be designed such that no part of the target is in the path of the beam when it is fully retracted, including rails, support structure, or tubing.

Figure 22:
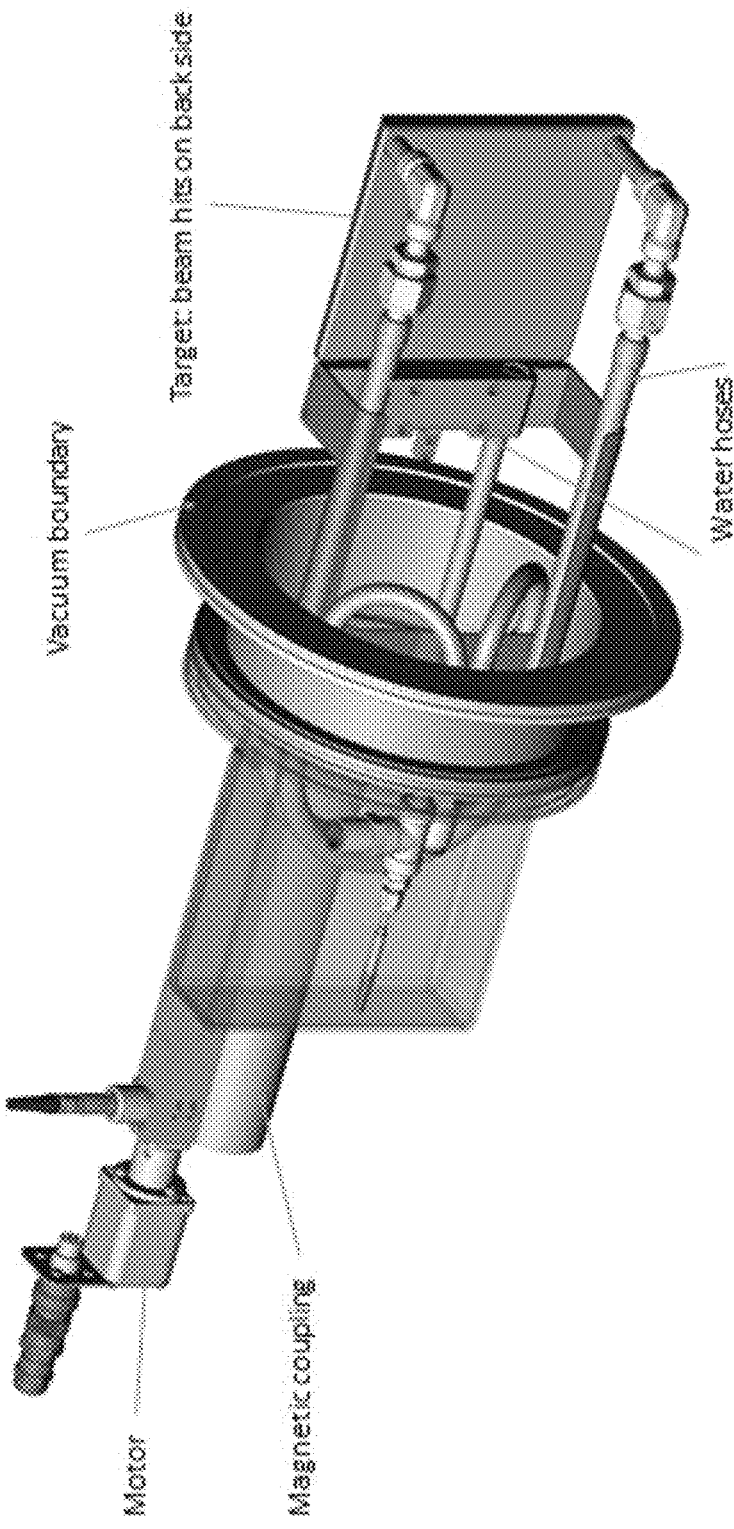
FIG. 22 shows an exemplary beam scraper configuration.

FIG. 22 provides an exemplary configuration of a beam scraper. The motor and magnetic coupling are shown outside of the vacuum boundary. The target and associated water hoses are shown inside the vacuum boundary. The solid target is used on beams that are smaller than 6" in diameter. When fully retracted, the part closest to the beam is the face of the target that is normally hit by the beam when it is extended, and that edge is more than 3" away from the centerline of the beam.

An alternative embodiment involves mounting the solid target on a hinge so that it swings into the beam path instead of linearly translating the target. This approach decreases the power density on target until it is fully closed, reduces the space requirements, and allows for simpler and less expensive feedthrough design. As a trade-off, the tubing might is more difficult to implement for this configuration. This approach allows a normally closed/open configuration, and is contemplated to have faster close/open times.

An alternative for systems that require an axisymmetric beam reaching the main target involves an iris-type beam scraper.

V. Automated Control Systems

In some embodiments, the systems and methods employ one or more automated control components. Such automated control components include, but are not limited to, a fiber-optic interlock, a health-monitoring system, an automated recovery system following arcing events, and a closed-loop control for managing beam stability.

A. Fiber-Optic Interlock

The high energy ion beam generators incorporate one or more, typically several, high-voltage sources. For safety reasons, a user/controller station should be electrically isolated from the rest of the device/system, and yet a component for connecting the user station to the interlock system of the rest of the device/system should exist. This creates a significant conflict between safety and operability. Approaches such as the use of an isolation transformer for providing electrical isolation between the two subsystems is not technically or economically practical because the presence of voltages of up to several hundred thousand volts.

An interlock is a number of normally-closed switches in series that must remain closed to indicate that a piece of equipment is safe to operate, or a number of normally-open switches in parallel that must remain open to indicate that a piece of equipment is safe to operate, or both a series loop and a parallel loop.

In some embodiments, the conflict between safety and operability is resolved by employing a fiber-optic connection between the device's interlock system and the user station's interlock. This provides the needed electrical isolation. To provide a robust connection that is immune to casual circumvention, in some embodiments a frequency generator is included in the fiber-optic interlock, as detailed below. In some embodiments, multiple-signal verification procedures are also implemented in order to protect the system from producing a false-closed result with a single-point failure.

A first attempt to address the challenge involved a fiber-optic transmitter that produced a light when the user station's interlock was closed. This method was not satisfactory because it did not include the user station properly, since the user station's interlock closed signal was not dependent on any components earlier in the interlock string.

To resolve the problems with the first implementation, a two-way link was installed. When the upstream interlock switches are closed, a light is transmitted to the user station through a fiber-optic cable. The light is converted to a voltage signal which passes through the interlock switches at the user station. Once the light signal from the device is present and the user station switches are all in the 'safe' position, a light is transmitted back to the device thus closing the interlock loop. The problem presented by this solution was that it was simple to circumvent the user station interlock devices by simply connecting the transmitter and receiver on the device, thus closing the loop regardless of the condition of the interlock switches in the user station.

The fiber-optic interlock signal was made frequency-dependent, in order to make it more difficult to circumvent the interlock system. A small frequency generator triggers the fiber-optic transmitter, causing the light to pulse at a set frequency. The receiver is configured to be sensitive to the frequency of the light pulses it is detecting, and if the proper frequency is not present, the receiver does not indicate that the interlock is safe.

Further, in order to allow for a single device to utilize multiple fiber-optic interlocks, a printed circuit board (PCB) was configured so that with proper tools, any one of four different frequencies can be selected. This also allows a single two-way link to use a different frequency for transmitting than it does for receiving, thus preserving the obstacle to an method of circumventing the integrity of the interlock signal.

Figure 23:
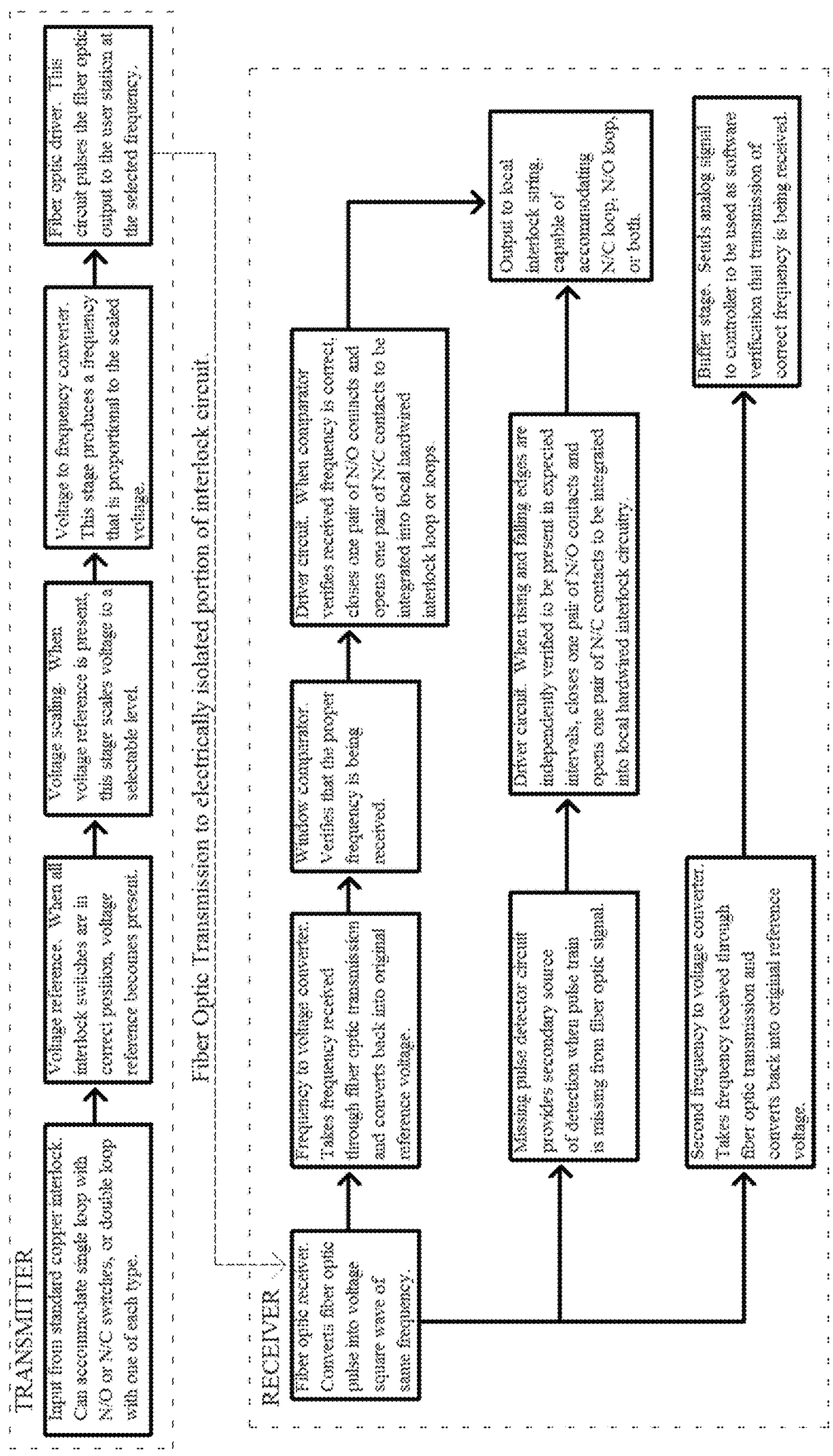
FIG. 23 shows an exemplary fiber optic interlock arrangement for communication between an electrically isolated high energy ion beam generator and a user control station.

FIG. 23 shows an exemplary block diagram for a fiber-optic interlock system that may be employed with the system. A fiber optic transmission is made between a transmitter and a received via an electrically isolated portion of an interlock circuit. The transmitter may employ an input from a standard copper interlock. This can accommodate a single loop with N/O (normally open) or N/C (normally closed) switches, or a double loop with one or each type. When all interlock switches are in a correct position, voltage reference becomes present. When voltage reference is present, voltage is scaled to a selectable level. A frequency converter produces a frequency that is proportional to the scaled voltage. A fiber optic drive circuit pulses the fiber optic output to the user station at the selected frequency.

At the received side, a fiber optic receiver converts fiber optic pulse into voltage square wave of the same frequency. In some embodiments, a frequency to voltage converter takes frequency received through the fiber optic transmission and coverts it back into the original reference voltage. A window comparator verifies the proper frequency is being received. When the comparator verifies that the received frequency is correct, a driver circuit closes on pair of N/O contacts and opens one pair of N/C contacts to be integrated into a local hardwired interlock loop or loops. An output to a local interlock string capable of accommodating an N/C loop, an N/O loop, or both is made. In some embodiments, a missing pulse detector circuit provides a secondary source of detection when the pulse train is missing from the fiber optic signal. When rising and falling edges are independently verified to be present in expected intervals, a driver circuit closes one pair of N/O contacts and opens one pair of N/C contracts to be integrated into a local hardwired interlock circuitry. An output to a local interlock string capable of accommodating an N/C loop, an N/O loop, or both is made. In some embodiments, a second frequency to voltage converter takes frequency received through the fiber optic transmission and coverts it back into the original reference voltage. Then a buffer stage sends analog signal to the controller to be used as software verification that transmission of correct frequency is being received. This component increases system safety to a desired level, while remaining technologically and economically practical.

B. Health Monitoring

Given the high power carried by the beam, it is important to ensure that it does not cause thermal damage to components of the system. Damage can be caused by the beam interacting with system components in an off-normal situation. Specific material selections and cooling mechanisms have been implemented for components that can interact with the beam such that different protection schemes are implemented depending on the energy density that might be deposited on each component.

In some embodiments, instrumentation and a plurality of sensors are integrated into the system for measuring temperatures and cooling water flow rates. These measurements allow for monitoring the amount of power being deposited on various cooled system components. The combination of thresholds for minimum flow rates, maximum temperature, and maximum power allow for protection of the system hardware. These values are continuously monitored by sensors covering all components that might be damaged by interaction with the beam. In some embodiments, each sensor has configurable levels above or below which an alarm is tripped, causing automated control system action to intervene and ensure safe operation and minimize or prevent damage.

In some embodiments sensors for liquid level are integrated into the system for measuring the presence of neutron moderator required for safe operation. In some embodiments a combination of signals from multiple sensors are used together to determine operation within safe parameters, for example voltage draw and current to determine resistance in a magnetic coil.

In some embodiments feedback signals from components are monitored to ensure operation within desired safety ranges, for example power draw on turbo molecular pumps and forced air cooling fans.

In some embodiments feedback signals from integrated components such as high voltage power supplies, gas flow controllers and magnetron power supplies are monitored and their output compared to expected set values to determine safe operation.

In some embodiments integrated components are prevented from being set to an unsafe set-point by the control algorithm, for example preventing a user from commanding the microwave generator when the system is not in a state where the microwave can be safely operated. Another example is preventing beam operation when any part of the system is not in a state to safely transport or accept beam.

In some embodiments, the health monitoring system has both "Alerts" and "Alarms." Sensors are configurable to signal an "Alert" condition if a signal deviates from a normal operating value, displaying a warning indicator to a user. A deviation that is greater in magnitude triggers an "Alarm," resulting in automated control system response to the condition. In some embodiments, an "Alarm" acts in a latching fashion and requires the user to reset the condition from the control system in order to remove the alarm status.

One of the challenges encountered with health monitoring on a particle accelerator is filtering out false positives due to short lived transients that cause nuisance tripping of alarms. High-voltage systems inherently create electromagnetic pulses (EMP) and therefore electromagnetic interference (EMI). Sensor and component data that is transmitted to the control system using analog voltage signals can be susceptible to EMI pickup. In some embodiments, the raw signal data is processed to filter out EMI to prevent nuisance tripping. In some embodiments, an alarm is not triggered until the duration of an individual signal is longer than characteristic for EMI pickup. In one example a single transient must exceed 75 milliseconds prior to tripping an alarm. Additionally, in some embodiments, the system is configured to trip if multiple EMI pickup events occur within a certain period of time. In one example, 5 transient events within a 3 second window of time is considered a valid tripping of an alarm. In some embodiments, both single events lasting longer than the characteristic EMI pickup and multiple events occurring within a certain period of time are analyzed together such that when either event occurs an alarm is tripped. This combination of counting EMI events and tracking them over time, but not tripping an alarm on individual EMI events, allows for reliable continuous operation.

The automated response from the control system to an "Alarm" can be a safe shutdown or an automated recovery. A safe shutdown, for example, is when the control system automatically turns off the accelerator and puts the components in a safe state. An automated recovery is, for example, when the control system takes a prescribed sequence of steps to return the system to normal operation.

C. Automated Recovery

Occasional "arc down" events, in which current finds a path from high voltage points to ground through an undesired path, are not entirely preventable in high-voltage accelerators. Preventing the system from remaining in an undesired state following an arc down initially required a trained user to be at the user interface to the control system and ready to act at all times. This is resource intensive. Recovery from an arc down required several components to be turned off and then back on in a certain sequence with fault clearing on certain components as part of the recovery sequence.

As an extension of the health-monitoring system described in section V(B) above, certain "Alarm" conditions are used to indicate that an arc down event has occurred. An automated recovery sequence is then executed to return the system to operation without user intervention and much more quickly than a human user. During an extended continuous run, this feature increased the effective uptime of the system from around 95% to greater than 98%.

In some embodiments, certain conditions are flagged in the system for automated recovery while others are flagged for human intervention. An example of an automated recovery from an arc down event on the high voltage power supply (hvps). The hvps arc down event is identified by an under-voltage alarm on the hvps and/or the extraction power supply. Following detection of the fault condition an automated recovery sequence is executed which includes the following steps: disable closed loop feedback, disable magnetron power supply, disable extraction power supply, clear system fault, reset hvps, enable extraction power supply, enable magnetron power supply and finally re-enable closed loop control. Any fault that has not been identified as having an automated recovery sequence triggers an automated shutdown sequence. An automated shutdown sequence includes steps to disable each component in a safe sequence. An example of a safe shutdown sequence includes the following steps: Disable closed loop control, disable magnetron power supply, disable all gas flow controllers and power supplies.

In some embodiments, if the recovery sequence is executed more than a configurable number of times within a window of time (e.g., 3 recovery attempts within a ten second period of time) the control system executes a safe shutdown rather than the recovery sequence.

The control system for the accelerator is responsible for monitoring components at high voltage, components at ground voltage, and for connecting to a user interface for human interaction. In some embodiments, communication between the different locations is performed over fiber-optic connections in order to maintain electrical isolation. In some embodiments, the main system controller is connected directly to the high voltage and ion source microwave power supply and can set these components deterministically to a safe state. Since there are multiple locations of components and non-deterministic communication protocols (Ethernet, TCP/IP) between the locations, a watchdog architecture is used to monitor connectivity. In the event of the loss of connection the system automatically and deterministically transitions to a safe state.

Due to the non-deterministic nature of the communication protocol, some amount of missed communication is expected. At times, resetting of a watchdog may be late. In some embodiments, rules are configured based on the frequently of the watchdog checks for connectivity and how late the resetting of the watchdog can be. This configurability reduces false positives where the watchdog sends the system to a safe state.

D. Closed-Loop Control for Beam Stability

Particular applications of a neutron generator require the neutron flux output to be maintained within 1% peak to peak of the flux set-point, with the flux set-point being a variable over five orders of magnitude. Open loop control by a skilled operator is insufficient to ensure that the flux output remains within the required accuracy, due to multiple variables affecting the system dynamics.

Closed-loop control of either the high voltage power supply (HVPS) set-point or of the beam scraper position demonstrated improved accuracy of the flux output and the ability to compensate for physical variations such as thermal fluctuations or target loading, and signal noise. Control of the HVPS set-point provides a faster dynamic response in the measured flux output. Closed-loop control yielded a visible and measurable improvement in the stability of the neutron flux output over time. It also reduces operator interaction with the high energy ion beam generator control system, which in turn reduces the potential for operator error.

Open-loop control is used to bring the system up to the initial neutron flux setpoint, after which closed-loop control is activated. The control gains are determined based on the selected neutron flux setpoint, ensuring closed-loop control over a smaller operating envelope. While closed-loop control is active, additional limits are placed on the control authority, in the form of maximum and minimum HVPS setpoints for a given neutron flux setpoint.

The physics of a neutron generator is nonlinear when considered over the entire machine operating regime, encompassing five orders of magnitude of neutron output. The mechanics of the beam scraper, for which a circular beam impinging on a flat plate with a straight edge, which allows a portion of the circular beam to proceed through, contribute further to the nonlinearity of the control problem.

A linear control strategy was applied to this system by enforcing operation over a small, linear portion of the system's operating envelope. Traditional control loop tuning methods can thus be applied to develop the gains specific to each operating point. While control of the HVPS setpoint was active, the scraper position was held steady, and vice versa. This removed the nonlinearity inherent in the scraper motion from the control problem.

Closed-loop control of the neutron flux output via control of the beam scraper position was successful, but it did not perform as well as control of the HVPS setpoint. The ability of the beam scraper position to control flux output was dependent on the initial position of the scraper. Using a linear control algorithm to set the position, which has a nonlinear effect on flux output, was not selected as optimal in favor of applying a linear control loop using the HVPS voltage as the control variable.

Further features of the control system include, but are not limited to, autotuning algorithms to accelerate development of control gains, dynamic signal analysis of the physical system, either in open or closed loop form, modeling the open-loop neutron generator system based on first principles, enabling state space or pole placement control algorithms, full system simulation to enable hardware in the loop (HIL) methods for selecting control schemes, fuzzy logic control algorithms to enable bumpless transfer between operating regimes, and generation of protocols to enable completely automated operation of the neutron generator system, including automated startup, turn off, and error handling.

E. Closed Loop Control for Beam Current

Particular Applications of a particle accelerator for ion implantation require beam current to be maintained within +/−1% of a current setpoint. Multiple signals are required to calculate beam current including high voltage power supply source current, extraction power supply resistor divider drain current and current losses due to leakage in the cooling water. Real-time calculation of the beam current from these signals is performed by the control system. Open loop control by a skilled operator is insufficient to ensure that the beam current output remains within the required accuracy, due to multiple variables affecting the system dynamics.

VI. Exemplary Applications

A. Thermal Neutron Radiography

Neutron radiography and tomography are proven techniques for the nondestructive testing of manufactured components in the aerospace, energy, and defense sectors. It is presently underutilized because of a lack of accessible, high flux neutron sources. Just like X-rays, when neutrons pass through an object, they provide information about the internal structure of that object. X-rays interact weakly with low atomic number elements (e.g. hydrogen) and strongly with high atomic number elements (e.g. metals). Consequently, their ability to provide information about low-density materials, in particular when in the presence of higher density materials, is very poor. Neutrons do not suffer from this limitation. They are able to pass easily through high density metals and provide detailed information about internal, low density materials. This property is extremely important for a number of components that require nondestructive evaluation including engine turbine blades, munitions, spacecraft components, and composite materials such as wind turbine blades. For all of these applications, neutron radiography provides definitive information that X-rays cannot. Neutron radiography is a complementary nondestructive evaluation technique that is able to provide the missing information.

Phoenix Nuclear Labs (PNL) has designed and built high yield neutron generators that drive a subcritical assembly, developed by SHINE Medical Technologies, to produce the medical radioisotope molybdenum-99 ("moly" for short). In some embodiments, such systems are adapted and modified for neutron radiography indications. In some embodiments, the system comprises one or more the features described in sections I through V above to provide efficient, cost-effective, robust, safe, and user-friendly neutron generation. In some embodiments, the system is further modified as described below.

The neutron generator used in this example was originally designed for the production of medical isotope and as such, requires a relatively high neutron yield. The amount of neutron radiation generated is above allowable levels for nearby personnel and thus the radiation generating portion of the device should be placed underground. Because part of the device is then underground, there is very limited space with which to configure the radiography system.

While the neutron yield of the PNL generator is very high for its size and cost, it is several orders of magnitude lower than for a typical neutron radiography facility, e.g. a nuclear reactor. Therefore, the neutron-detecting medium should be in close proximity to the neutron source. Conversely, at a nuclear reactor, it is typical that the detection medium can be several meters away from the neutron source, allowing for space in which to place filters to mitigate undesirable types of radiation, mainly stray gamma rays, which will partially blur the image during acquisition.

For the PNL system, the close proximity of the neutron detector results in a large flux of gamma radiation, since it decreases roughly with the inverse square of the distance from the source, while precluding the use of enough gamma-filtering materials such as lead or bismuth, which is exacerbated by the limited space available underground in the PNL system.

The PNL system uses deuterium-deuterium fusion to generate neutrons and does not produce gamma rays in the initial reactions. It is the subsequent reactions between the neutrons and surrounding materials that are of interest. The radiography setup has a neutron guide (e.g., collimator), layered on the inside with cadmium sheeting, which is a highly neutron-absorbing material. This ensures that neutrons not aimed straight at the detector will essentially be excluded from the beam. In some embodiments, where two gold foils are employed, one is covered with cadmium to simulate a standard neutron activation analysis technique to determine the composition of thermal and fast neutrons in the beam. However, the cadmium releases a 550 keV gamma ray following the neutron absorption process. This gamma ray can strike the detector and cause some fogging of the image. This is an unavoidable process and should be decreased as much as possible.

On the outside of the neutron guide (e.g., collimator), there is a very large neutron population comprised of a spectrum of energies between 0 and 2.45 MeV. It is generally the lower energy neutrons that are used in the imaging process and so it is desirable to decrease the energy of the neutrons as much as possible. However, these lower energy neutrons are more likely to produce subsequent gamma rays when absorbed by surrounding materials, as in the case of the cadmium. Low-energy neutrons cause these gamma production events whether they are inside or outside of the neutron guide r. Since it is only the neutrons inside the guide that are useful for the image acquisition, the neutrons outside the guide should be absorbed as well. This is accomplished herein by a layer of borated polyethylene (BPE), which absorbs the neutrons before they can cause gamma producing events in the cadmium. The boron, though, emits a 478 keV gamma ray, which can be absorbed easily by a layer of lead between the BPE and the neutron guide walls. In some embodiments, the borated polyethylene (BPE) on the collimator is conical in shape, extends the length of the collimator (e.g., approximately 40 inches), and is 1 inch thick. The BPE on the imaging box where the images are collected is rectangular in shape, surrounding the box on all sides except for the opening where the collimator end is, and is also 1 inch thick.

Some neutrons can traverse the borated polyethylene to still produce gamma events in the cadmium. These are known as epithermal neutrons and also should be mitigated. In order to slow these neutrons down to energies that allow for absorption, a 6-inch layer of high density polyethylene (HDPE) has been added, surrounding the layer of BPE. In some embodiments, the HDPE layer is from 4 to 8 inches thick. The HDPE layer aids in moderation of the epithermal neutrons to thermal energies so that they are absorbed by the boron in the BPE without ever reaching the cadmium layer. Further, a diffusion region comprised of air has been introduced that allows for relatively the same optical path length for thermal neutrons to enter the aperture of the collimator, while increasing the distance that fast neutrons must traverse before entering. In some embodiments, the air diffusion region is 6 cm long and 2.5 cm in diameter. This longer path length for fast neutrons allows them more opportunities to scatter in the moderating medium and thus be slowed to more thermal energies. Alternative materials such as water and graphite may be used in place of the HDPE, although HDPE provides a more cost-effective material that can be readily machined.

Finally, the collimator has been offset so as not to "look" directly at the fast neutron source. This ensures that what the collimator "sees" will be more of the thermal neutron population, reducing the fast neutron content through the aperture. In some embodiments, the collimator is offset both radially and tangentially from the neutron source in order to not have direct line of sight to the neutron source and to also place moderating material between the collimator aperture and the neutron source. In some embodiments, it is offset by 17 cm radially and 14 cm tangentially. The position is found by observing where the highest population of thermal neutrons exists and then placing the collimator aperture into that region. The placement of the collimator then disrupts the population. Further shifting is performed to find the location that produces the highest thermal neutron population at the opposite end of the collimator.

The MCNP (Monte Carlo N-Particle) transport code has been used to simulate the neutron transport and gamma ray generation from neutron capture in the various materials. The simulation utilizes libraries of nuclear data from calculated and empirical data for scattered and absorbed radiation. The simulation suite has been available for decades and is continually being updated and enhanced.

Various moderation materials have been tested, including light water, heavy water and graphite, in attempts to increase the available thermal neutron flux on the gold foils, reduce the fast and epithermal flux on the foils and reduce the gamma rays at the end of the collimator. Foil measurements have been attempted to verify that the model itself is converging on accurate predictions.

Optimization of the MCNP models has been carried out to determine optimum thicknesses of HDPE, BPE, lead, moderator material and geometry, and the diffusion region. This optimization has revealed practical geometries in terms of sizes and weight. One great difficulty with such a heavily shielded geometry is that neutron transport through the collimator aperture is very low, approximately 7 orders of magnitude lower than the neutron source production. In order to obtain high enough counting statistics for precise predictions, very long simulations must be run or very clever particle weighting must be performed.

The first tests were performed only with blocks of graphite as moderating material with no BPE or HDPE on the outside layers of the collimator. It was found then that many fast neutrons could stream through the interstitial spacing between the blocks of graphite, increasing the fast neutron population at the image plane. It was also realized that the thermal neutrons outside the collimator were creating a massive population of gamma rays from the inner layer of cadmium due to a lack of shielding on the outside of the collimator.

Water was then added to the system to fill in all the cracks in the graphite and provide a 100% full moderator. The water, however, is a relatively highly absorbing material of thermal neutrons and so while the fast neutron flux went down, so did the thermal neutron population. A partially heavy water moderator was built into the graphite stack. Heavy water is both highly scattering and lightly absorbing of neutrons, making for an outstanding moderating material. The thermal neutron population was found to increase, while the fast neutron population stayed relatively constant. However, heavy water is very expensive and an ideal configuration of this material for a moderator was impractical, especially not submerged in light water.

As stated previously, the fast and thermal neutron population is very high and especially so in the very close proximity that must be worked with in the underground chamber. Due to this limitation, very carefully chosen shielding must be used to block both thermal neutrons and thermalize the fast neutron population. The embodiments described herein achieve this result.

Figure 24:
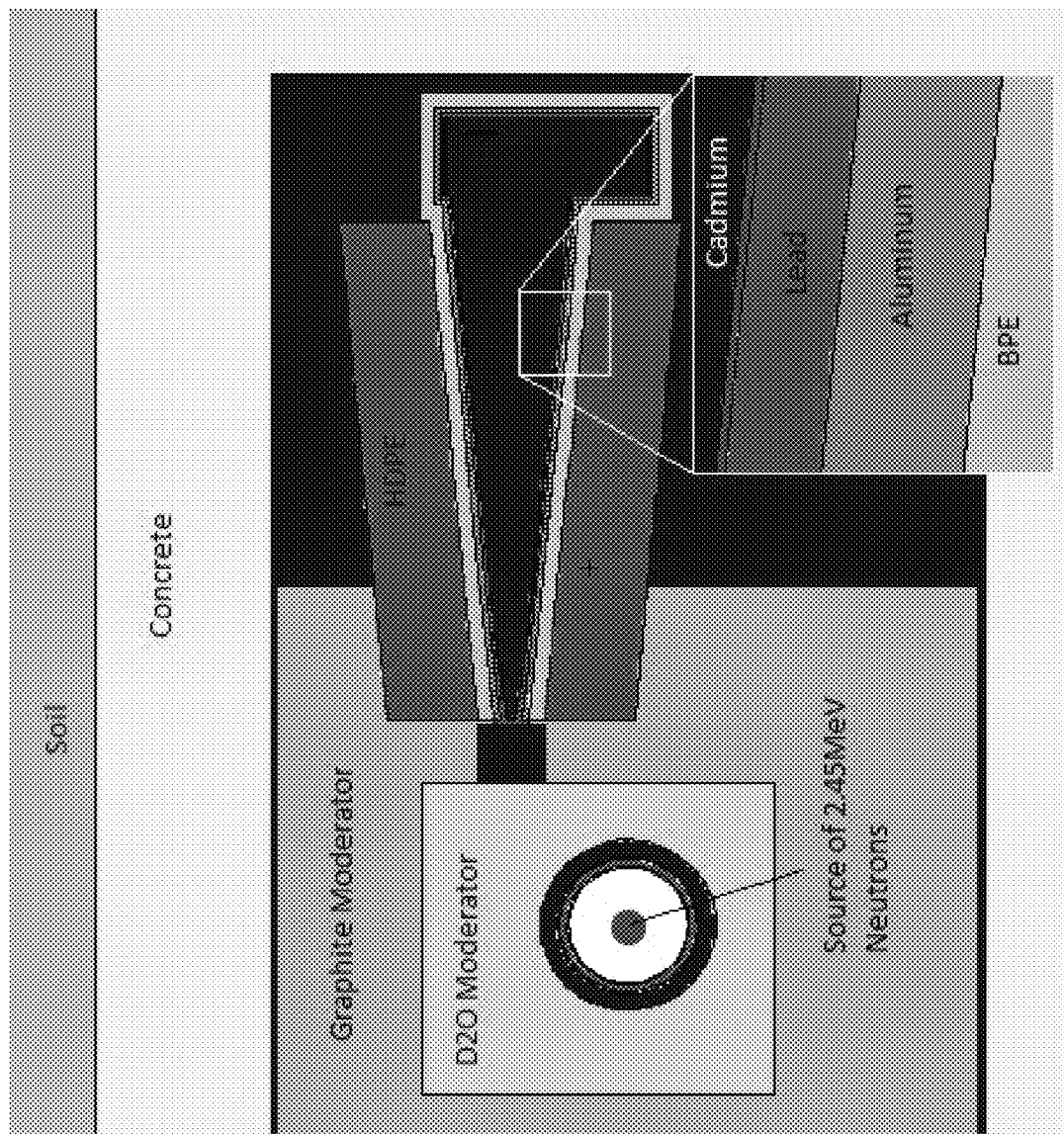
FIG. 24 shows a schematic of a moderator, collimator, and imaging enclosure for thermal neutron radiography applications.

An exemplary configuration is shown in FIG. 24 that provides an excellent solution for a high thermal/low fast neutron flux, while reducing the gamma population at the image plane. Optimization of all geometries should be performed to achieve the optimum thickness of HDPE, BPE, lead, moderator material and geometry, and diffusion region. For one designed system, it has been determined that a large heavy water vessel should be used, surrounded by HDPE and BPE to optimize the moderator and shield the environment from unwanted radiation. This is configured as an above-ground system, but the image plane is still in the near vicinity of the neutron source. Because of this configuration, the careful design described herein is needed to enhance the desired radiation features while suppressing the unwanted radiation such as gamma rays and fast neutrons.

B. Semiconductor Fabrication

The systems and methods described herein (e.g., using a hydrogen ion particle accelerator) find use in semiconductor fabrication. Such systems find use, for example, in the formation of thin films of material from a bulk substrate. The thin film of material is separated from the bulk substrate by generating a cleave region formed by particles implanted from a hydrogen ion particle beam and then cleaving at the cleave region. In some embodiments, the thin films are wafer used in the production of solar panels (e.g., solar grade photovoltaic (PV) wafers) or light emitting diodes (LEDs). The wafers may be of any desired shape (e.g., circular, square, or rectangular). The wafers may be of a thickness of less than 100 micrometers. In some embodiments, the wafers have a thickness of 2-70 microns. In some embodiments, the wafers have a thickness of 4-20 microns.

Silicon wafers have conventionally been produced by first creating a single crystalline cylindrical ingot of silicon (see e.g., U.S. Pat. No. 9,499,921, herein incorporated by reference in its entirety). In one example, circular wafers are sliced off the end of the cylindrical ingot by a diamond coated wire. The diamond coated wire is typically about 20 micrometers in diameter. This method of producing wafers by slicing the wafer off of the end of the cylindrical ingot creates a waste of the thickness of the diamond coated wire, or about 20 micrometers, by shaving that amount of the thickness into dust. In other examples, the crystalline cylindrical ingot is trimmed to a square or rectangular shape by squaring the ingot into an elongated rectangular box shape about 1.5 meters long. In the process of squaring the ingot, valuable material is removed as waste material. Because the costs of materials can dramatically influence adaptation of certain products and technologies, such waste and inefficiency can have significant implications.

The systems provided herein, because of their cost effectiveness, efficiency, robustness, safety, and other desired parameters permit the generation of desired semiconductor materials at previously unattainable scales and efficiencies, reducing overall manufacturing costs and facilitating expanded markets for such materials. The high-energy ion beam systems described herein may be integrated as the source of hydrogen ions into existing fabrication systems and processes. For example, existing systems that employ a high-energy ion beam generator integrated with a wafer manufacturing component can substitute their ion beam generators for those described herein. Examples of such systems include, but not limited to, those of U.S. Pat. App. Nos. 2015/0340279, 2015/0044447, and 2016/0319462, U.S. Pat. Nos. 7,939,812, 7,982,197, 7,989,784, 8,044,374, 8,058,626, 8,101,488, 8,242,468, 8,247,260, 8,257,995, 8,268,645, 8,324,592, 8,324,599, 8,338,209, 9,404,198, and 9,499,921, and in the SIGEN POLYMAX systems (see, e.g., Kerf-less wafer production, Sigen, Photon's 4th PV Production Equipment Conference, Mar. 4, 2009), SOITEC SMART CUT systems (see, e.g., www.soitec.com/en/products/smart-cut), and AXCELIS high energy implant systems in the PURION, OPTIMA, and PARADIGM SERIES systems (see, e.g., www.axcelis.com/products/high-energy, and Felch et al., Ion implantation for semiconductor devices: The largest use of industrial accelerators, Proceedings of PAC2013, Pasadena, CA USA), the disclosures of which are herein incorporated by reference in their entireties.

All publications and patents provided herein incorporated by reference in their entireties. Various modifications and variations of the described compositions and methods of the invention will be apparent to those skilled in the art without departing from the scope and spirit of the invention. Although the invention has been described in connection with specific preferred embodiments, it should be understood that the invention as claimed should not be unduly limited to such specific embodiments. Indeed, various modifications of the described modes for carrying out the invention that are obvious to those skilled in the relevant fields are intended to be within the scope of the present invention.

What is claimed is:

1. A method of steering an ion beam to a target aperture in a neutron generator system, the method comprising:
    producing an ion beam using an accelerator of the neutron generator system, the neutron generator system further comprising a steering component and a target aperture, wherein the target aperture separates the accelerator from a gas target;
    measuring a temperature at a plurality of locations around the target aperture using a plurality of thermal sensors positioned near an upstream-facing surface of the target aperture; and
    directing the ion beam through the target aperture using the steering system.

2. The method of claim 1, wherein directing the ion beam through the target aperture comprises focusing the ion beam to the target aperture using the steering component to minimize temperature at the target aperture.

3. The method of claim 1, wherein the plurality of thermal sensors comprises four thermal sensors equally spaced at 90-degree intervals about an axis of the target aperture.

4. The method of claim 1, wherein the plurality of thermal sensors comprise thermocouples.

5. The method of claim 4, wherein the thermocouples are copper-constantan thermocouples.

6. The method of claim 1, wherein the plurality of thermal sensors are selected from the group consisting of platinum resistance temperature detectors (RTDs), thermistors, and semiconductor temperature sensors.

7. The method of claim 1, further comprising a processor that receives temperature signals from the plurality of thermal sensors.

8. The method of claim 7, wherein the processor sums temperature signals from the plurality of thermal sensors and generates an average target aperture temperature.

9. The method of claim 8, wherein said processor instructs the steering component to adjust the ion beam position based on the average target aperture temperature to minimize the temperature of the target aperture.

10. The method of claim 1, further comprising contacting the gas target with the ion beam, thereby generating neutrons.

11. A method of steering an ion beam to a target aperture in a neutron generator system comprising:
measuring temperature at a plurality of locations around the target aperture; and
steering the ion beam to minimize temperature at the target aperture; wherein the neutron generator system comprises
an accelerator that produces the ion beam, wherein the target aperture separates the accelerator and a gas target;
a plurality of thermal sensors positioned to measure temperature at the plurality of locations around the target aperture; and
a steering component that steers the ion beam and focuses the ion beam to the target aperture.

12. The method of claim 11, further comprising contacting the gas target with the ion beam.

13. The method of claim 12, contacting the gas target with the ion beam thereby inducing a fusion reaction between the ion beam and the gas target to generate neutrons.

14. The method of claim 1, wherein the plurality of thermal sensors is positioned near an upstream-facing surface of the target aperture.

15. The method of claim 1, wherein the plurality of thermal sensors comprises four thermal sensors equally spaced at 90-degree intervals about an axis of the target aperture.

16. The method of claim 1, wherein the plurality of thermal sensors comprise thermocouples.

17. The method of claim 11, wherein the plurality of thermal sensors are selected from the group consisting of platinum resistance temperature detectors (RTDs), thermistors, and semiconductor temperature sensors.

18. The method of claim 1, the neutron generator system further comprises a processor and the method further comprises:
receiving, using the processor, temperature signals from the plurality of thermal sensors; and
generating, using the processor, an average target aperture temperature based on temperature signals.

19. The method of claim 18 further comprising adjusting the ion beam position based on the average target aperture temperature to reduce the temperature of the target aperture.

* * * * *